United States Patent [19]
Minohara et al.

[11] Patent Number: 5,214,426
[45] Date of Patent: May 25, 1993

[54] ROTARY ENCODER HAVING ABSOLUTE ANGLE PATTERNS AND RELATIVE ANGLE PATTERNS

[75] Inventors: Kiyomi Minohara, Takarazuka; Atsushi Abe, Suita; Toshihiro Niidome, Nishinomiya, all of Japan

[73] Assignee: Furuno Electric Company, Limited, Hyogo, Japan

[21] Appl. No.: 652,840

[22] PCT Filed: Jul. 10, 1989

[86] PCT No.: PCT/JP89/00693
§ 371 Date: Feb. 22, 1991
§ 102(e) Date: Feb. 22, 1991

[87] PCT Pub. No.: WO90/00720
PCT Pub. Date: Jan. 25, 1990

[30] Foreign Application Priority Data

Jul. 12, 1988 [JP] Japan ................................. 63-172950
Jul. 13, 1988 [JP] Japan ................................. 63-175575
Aug. 17, 1988 [JP] Japan ................................. 63-204032

[51] Int. Cl.$^5$ .......................... G01B 5/34; H03M 1/30
[52] U.S. Cl. ........................................ 341/13; 341/11; 250/237 G
[58] Field of Search ....................... 341/7, 8, 9, 11, 13, 341/15; 250/231.18, 237 G

[56] References Cited
U.S. PATENT DOCUMENTS

| | | | |
|---|---|---|---|
| 3,388,392 | 6/1968 | Fisher | 341/7 |
| 4,253,021 | 2/1981 | Ernst | 250/237 G X |
| 4,384,204 | 5/1983 | Tamaki et al. | 250/231.18 X |
| 4,465,373 | 8/1984 | Tamaki et al. | 341/13 |
| 4,602,242 | 7/1986 | Kimura | 341/13 |
| 4,757,196 | 7/1988 | Yamada et al. | 341/13 |
| 4,965,446 | 10/1990 | Vyse | 341/13 |

Primary Examiner—Howard L. Williams
Attorney, Agent, or Firm—Jordan and Hamburg

[57] ABSTRACT

The present invention relates to a rotary encoder for detecting a rotational angle. A rotary encoder according to the present invention comprises a rotating body provided on its surface with a plurality of digital code patterns representative of absolute angle ranges and a plurality of relative angle patterns representative of relative angles, a high-order angle data producing means (1,2,5,7) for reading the absolute angle patterns to produce high-order angle data, and a low-order angle data producing means (1,2,5,7) for reading the relative angle patterns to produce low-order angle data. The rotary encoder according to the present invention ensures medium resolution by means of the digital code patterns and attains finer resolution by means of the relative angle patterns, whereby the rotational angle can be detected with superior resolution.

15 Claims, 24 Drawing Sheets

| ANGLE | FLAG | HUNDREDS PLACE | | | TENS PLACE | | | | ONES PLACE | | | |
|---|---|---|---|---|---|---|---|---|---|---|---|---|
| 99  | 0 0 0 | 0 | 1 | 0 | 0 | 1 | 1 | 0 | 0 | 1 |
| 100 | 1 1 0 | 0 | 0 | 0 | 0 | 0 | 0 | 0 | 0 | 0 |
| 101 | 0 0 0 | 1 | 0 | 0 | 0 | 0 | 0 | 0 | 0 | 1 |
| ⋮ | | | | | | | | | | | |
| 109 | 0 0 0 | 1 | 0 | 0 | 0 | 0 | 1 | 0 | 0 | 1 |
| 110 | 1 1 0 | 0 | 0 | 0 | 0 | 0 | 0 | 0 | 0 | 1 |
| ⋮ | | | | | | | | | | | |
| 119 | 0 0 0 | 1 | 0 | 0 | 0 | 1 | 1 | 0 | 0 | 1 |
| 120 | 1 1 0 | 0 | 0 | 0 | 0 | 0 | 0 | 0 | 1 | 0 |
| 121 | 0 0 0 | 1 | 0 | 0 | 1 | 0 | 0 | 0 | 0 | 1 |
| 122 | 0 0 0 | 1 | 0 | 0 | 1 | 0 | 0 | 0 | 1 | 0 |
| 123 | 0 0 0 | 1 | 0 | 0 | 1 | 0 | 0 | 1 | 1 | 1 |
| 124 | 0 0 0 | 1 | 0 | 0 | 1 | 0 | 0 | 1 | 0 | 0 |
| 125 | 0 0 0 | 1 | 0 | 0 | 1 | 0 | 0 | 1 | 0 | 1 |
| 126 | 0 0 0 | 1 | 0 | 0 | 1 | 0 | 0 | 1 | 1 | 0 |
| 127 | 0 0 0 | 1 | 0 | 0 | 1 | 0 | 0 | 1 | 1 | 1 |
| 128 | 0 0 0 | 1 | 0 | 0 | 1 | 0 | 1 | 0 | 0 | 0 |
| 129 | 0 0 0 | 1 | 0 | 0 | 1 | 0 | 1 | 0 | 0 | 1 |
| 130 | 1 1 0 | 0 | 0 | 0 | 0 | 0 | 0 | 0 | 1 | 1 |
| 131 | 0 0 0 | 1 | 0 | 0 | 1 | 1 | 0 | 0 | 0 | 1 |
| 132 | 0 0 0 | 1 | 0 | 0 | 1 | 1 | 0 | 0 | 1 | 0 |
| ⋮ | | | | | | | | | | | |

| ANGLE | FLAG | HUNDREDS PLACE | | | TENS PLACE | | | | ONES PLACE | | | |
|---|---|---|---|---|---|---|---|---|---|---|---|---|
| | X11 | X10 | X9 | X8 | X7 | X6 | X5 | X4 | X3 | X2 | X1 | X0 |
| 349 | 0 | 0 | 1 | 1 | 0 | 1 | 0 | 0 | 1 | 0 | 0 | 1 |
| 350 | 1 | 0 | 0 | 0 | 0 | 0 | 0 | 0 | 0 | 1 | 0 | 1 |
| | (0 | 0 | 1 | 1 | 0 | 1 | 0 | 1 | 0 | 0 | 0 | 0) |
| 351 | 0 | 0 | 1 | 1 | 0 | 1 | 0 | 1 | 0 | 0 | 0 | 1 |
| 352 | 0 | 0 | 1 | 1 | 0 | 1 | 0 | 1 | 0 | 0 | 1 | 0 |
| 353 | 0 | 0 | 1 | 1 | 0 | 1 | 0 | 1 | 0 | 0 | 1 | 1 |
| 354 | 0 | 0 | 1 | 1 | 0 | 1 | 0 | 1 | 0 | 1 | 0 | 0 |
| 355 | 0 | 0 | 1 | 1 | 0 | 1 | 0 | 1 | 0 | 1 | 0 | 1 |
| 356 | 0 | 0 | 1 | 1 | 0 | 1 | 0 | 1 | 0 | 1 | 1 | 0 |
| 357 | 0 | 0 | 1 | 1 | 0 | 1 | 0 | 1 | 0 | 1 | 1 | 1 |
| 358 | 0 | 0 | 1 | 1 | 0 | 1 | 0 | 1 | 1 | 0 | 0 | 0 |
| 359 | 0 | 0 | 1 | 1 | 0 | 1 | 0 | 1 | 1 | 0 | 0 | 1 |
| 0 | 1 | 1 | 1 | 0 | 0 | 0 | 0 | 0 | 0 | 0 | 0 | 0 |
| | (0 | 0 | 0 | 0 | 0 | 0 | 0 | 0 | 0 | 0 | 0 | 0) |
| 1 | 0 | 0 | 0 | 0 | 0 | 0 | 0 | 0 | 0 | 0 | 0 | 1 |

FIG.20

| ANGLE | HUNDREDS PLACE | | TENS PLACE | | | ONES PLACE | | | |
|---|---|---|---|---|---|---|---|---|---|
| 99  | 0 | 0 | 1 | 0 | 0 | 1 | 1 | 0 | 0 | 1 |
| 100 | 0 | 1 | 0 | 0 | 0 | 0 | 0 | 0 | 0 | 0 |
| 101 | 0 | 1 | 0 | 0 | 0 | 0 | 0 | 0 | 0 | 1 |
| ⋮ | | | | | | | | | | |
| 109 | 0 | 1 | 0 | 0 | 0 | 0 | 1 | 0 | 0 | 1 |
| 110 | 0 | 1 | 0 | 0 | 0 | 1 | 0 | 0 | 0 | 0 |
| ⋮ | | | | | | | | | | |
| 119 | 0 | 1 | 0 | 0 | 0 | 1 | 1 | 0 | 0 | 1 |
| 120 | 0 | 1 | 0 | 0 | 1 | 0 | 0 | 0 | 0 | 0 |
| 121 | 0 | 1 | 0 | 0 | 1 | 0 | 0 | 0 | 0 | 1 |
| 122 | 0 | 1 | 0 | 0 | 1 | 0 | 0 | 0 | 1 | 0 |
| 123 | 0 | 1 | 0 | 0 | 1 | 0 | 0 | 0 | 1 | 1 |
| 124 | 0 | 1 | 0 | 0 | 1 | 0 | 0 | 1 | 0 | 0 |
| 125 | 0 | 1 | 0 | 0 | 1 | 0 | 0 | 1 | 0 | 1 |
| 126 | 0 | 1 | 0 | 0 | 1 | 0 | 0 | 1 | 1 | 0 |
| 127 | 0 | 1 | 0 | 0 | 1 | 0 | 0 | 1 | 1 | 1 |
| 128 | 0 | 1 | 0 | 0 | 1 | 0 | 1 | 0 | 0 | 0 |
| 129 | 0 | 1 | 0 | 0 | 1 | 0 | 1 | 0 | 0 | 1 |
| 130 | 0 | 1 | 0 | 0 | 1 | 1 | 0 | 0 | 0 | 0 |
| 131 | 0 | 1 | 0 | 0 | 1 | 1 | 0 | 0 | 0 | 1 |
| 132 | 0 | 1 | 0 | 0 | 1 | 1 | 0 | 0 | 1 | 0 |
| ⋮ | | | | | | | | | | |

FIG.24

| | | | | | | | | | | |
|---|---|---|---|---|---|---|---|---|---|---|
| 198 | 0 | 1 | 1 | 0 | 0 | 1 | 1 | 0 | 0 | 0 |
| 199 | 0 | 1 | 1 | 0 | 0 | 1 | 1 | 0 | 0 | 1 |
| 200 | 1 | 0 | 0 | 0 | 0 | 0 | 0 | 0 | 0 | 0 |
| 201 | 1 | 0 | 0 | 0 | 0 | 0 | 0 | 0 | 0 | 1 |
| ⋮ | | | | | | | | | | |
| 300 | 1 | 1 | 0 | 0 | 0 | 0 | 0 | 0 | 0 | 0 |
| ⋮ | | | | | | | | | | |
| 349 | 1 | 1 | 0 | 1 | 0 | 0 | 1 | 0 | 0 | 1 |
| 350 | 1 | 1 | 0 | 1 | 0 | 1 | 0 | 0 | 0 | 0 |
| 351 | 1 | 1 | 0 | 1 | 0 | 1 | 0 | 0 | 0 | 1 |
| 352 | 1 | 1 | 0 | 1 | 0 | 1 | 0 | 0 | 1 | 0 |
| 353 | 1 | 1 | 0 | 1 | 0 | 1 | 0 | 0 | 1 | 1 |
| 354 | 1 | 1 | 0 | 1 | 0 | 1 | 0 | 1 | 0 | 0 |
| 355 | 1 | 1 | 0 | 1 | 0 | 1 | 0 | 1 | 0 | 1 |
| 356 | 1 | 1 | 0 | 1 | 0 | 1 | 0 | 1 | 1 | 0 |
| 357 | 1 | 1 | 0 | 1 | 0 | 1 | 0 | 1 | 1 | 1 |
| 358 | 1 | 1 | 0 | 1 | 0 | 1 | 1 | 0 | 0 | 0 |
| 359 | 1 | 1 | 0 | 1 | 0 | 1 | 1 | 0 | 0 | 1 |
| 0 | 0 | 0 | 0 | 0 | 0 | 0 | 0 | 0 | 0 | 0 |
| 1 | 0 | 0 | 0 | 0 | 0 | 0 | 0 | 0 | 0 | 1 |
| ⋮ | | | | | | | | | | |

FIG.24(CONT.)

ROTARY ENCODER HAVING ABSOLUTE ANGLE PATTERNS AND RELATIVE ANGLE PATTERNS

TECHNICAL FIELD

The present invention relates to a rotary encoder for detecting a rotational angle.

BACKGROUND ART

Conventionally, a rotary encoder has been used for detecting the rotational angle of a rotor or a rotating member to be measured. A prior art rotary encoder generally used is provided with a rotating disc having optical patterns formed thereon and with an optical sensor disposed in the vicinity of the rotating disc for reading the optical patterns. When a rotational angle of the rotating member is desired to be detected in the form of an absolute value, optical patterns are provided on the rotating disc in the form of a digital code indicative of an absolute angle or corresponding to the angle.

PROBLEMS TO BE SOLVED BY THE INVENTION

With such conventional rotary encoders for detecting the absolute rotational angle of a rotating disc, the pitch of digital code patterns must be decreased and the number of bits thereof be increased in order to enhance resolution with the rotational angle to be measured. The requirements result in a large-sized device including the digital code patterns. If the diameter of a code plate is required to be made the same, the digital code patterns must be formed densely in a circumferential direction of the code plate, which demands a high accuracy in machining the code plate and in positioning a light source and an optical sensor.

In order to solve problems arising in enhancing resolution in measurement of rotational angles, there has been proposed a rotary encoder in the patent publication of an unexamined Japanese patent application No. 62-54122. The rotary encoder proposed here is arranged in such a way that helical (spiral) patterns are provided on a rotating disc and a sensor is provided to detect a position at which the sensor crosses the pattern to obtain an angle data. But, with the the construction of the rotary encoder proposed, an angle is detected by reading a so-called analog pattern and hence the degree of resolution in measurement of rotational angles depends largely on preciseness of the helical analog pattern. Therefore, high accuracy machining is required in order to obtain a desired resolution in measurement of rotational angles over the whole circumference.

An object of the present invention is to provide a rotary encoder which is capable of improving resolution in measurement of rotational angles with ease by ensuring a medium degree of resolution by means of digital codes and attaining a higher degree of resolution by means of analog patterns.

With the prior art rotary encoders for detecting absolute angles of a rotating disc as explained in the foregoing, code patterns are formed with an opaque material on a transparent plate made of glass or transparent resin and the codes are read by detecting the presence or absence of transmitted light. The transparent material such as a glass plate or transparent resin has caused light to be refracted or scattered, which has resulted in false readings of codes. Further, with the prior art rotary encoders, the process of forming patterns is complicated and production thereof is costly.

Although it is possible to provide code patterns by forming slits in an opaque member such as a metal plate, there are presented the following drawbacks.

FIG. 24 shows the relationship between angles and corresponding codes. In the figure, each angle (of 0 through 359 degrees) is expressed by the BCD code system wherein a digit in hundreds place, a digit in tens place and a digit in ones place are expressed by two bits, four bits and four bits respectively. If one slit is to be formed at a portion corresponding to the presence of a bit "1", for example, each angle of 100 degrees through 199 degrees requires one slit to be formed at each corresponding one of successive positions of 2° bit of the digits in hundreds place, each angle of 200 degrees through 299 degrees requires one slit to be formed at each corresponding one of successive positions of $2^1$ bit of the digits in hundreds place, and further all the angles from 300 degrees through 359 degrees require two slits to be formed at two corresponding positions of the two bits thereby forming long continuous slits. Thus, slits are formed in succession in a circumferential direction, the rotating disc will be physically divided into an inner and an outer parts along a boundary in the form of a series of slits.

Another object of the present invention is to provide a rotary encoder in which each code indicative of an absolute angle is transformed into a pattern of slits such that a series of patterns has areas or portions where no slits are formed to make the slits discontiguous.

SUMMARY

According to a first feature of the present invention, a rotary encoder comprises a rotating body provided on its surface with patterns representative of absolute angle ranges and with patterns representative of relative angles, a high-order angle data generating means for reading the absolute angle patterns to generate high-order angle data, and a low-order angle data generating means for reading the relative angle patterns to generate low-order angle data.

Another feature of a rotary encoder according to the present invention is that the rotating body comprises a rotating disc.

Another feature of a rotary encoder according to the present invention is that the rotating body comprises a cylindrical body.

A rotary encoder according to the present invention comprises a code plate made in the form of a rotating disc which is provided with a plurality of digital code patterns each indicative of an absolute angle range in a radial direction and a plurality of linear patterns each indicative of a relative angle which is formed within a corresponding absolute angle range and is inclined with respect to the radial direction of the rotating disc, a high-order angle data generating means for reading the digital code patterns to produce high-order angle data, and a low-order angle data generating means for reading the linear patterns to produce low-order angle data.

Still another feature of a rotary encoder according to the invention is that the digital code patterns and the linear patterns are respectively and partially overlapped with each other circumferentially by a given angle in the boundary areas of each absolute angle range.

According to a second feature of the present invention, a rotary encoder comprising a code plate made in the form of a rotating disc which is provided with optical patterns indicative of absolute angles and an optical sensor for reading the codes is characterized in that as the code plate, there is used an opaque plate having codes formed by slits and specified angles are coded in a coding way different from that for other angles so that slits are not contiguous in areas outside of a sector of a predetermined angle in an angular direction, and there is provided angle data generating means for generating angle data based on the output data of the optical sensor.

With the rotary encoder according to the first feature of the present invention, there are formed digital code patterns indicative of absolute angle ranges in a radial direction and linear patterns which are inclined with respect to the radial direction of the rotating disc and within the respective absolute angle ranges. The high-order angle data generating means reads the digital code patterns to produce high-order angle data. While, the low-order angle data generating means reads the linear patterns to produce relative angles within the absolute angle ranges wherein the digital codes are formed, as the low-order angle data. Thus, an absolute angle with medium resolution is obtained based on the digital code patterns, and the absolute angle is interpolated within each corresponding absolute angle range by utilizing linear patterns to ensure fine resolution.

The digital code patterns are partially overlapped each other by a given angle in a circumferential direction in the boundary areas of contiguous absolute angle ranges and the linear patterns are partially overlapped each other by a given angle in a circumferential direction in the boundary areas of contiguous absolute angle ranges so that even when the sensor for reading the digital code patterns and the linear patterns is in the boundary areas of contiguous absolute angle ranges, the sensor is capable of reading the digital code patterns and the linear patterns as substantially continuous patterns. Accordingly, even where the preciseness of the digital code and linear patterns and/or the accuracy of attachment of the sensor are not so high, there occur no false readings even in the boundary areas of two contiguous absolute angle spans.

Also, a rotary encoder according to the present invention is provided with code patterns indicative of absolute angle ranges formed on the rotating disc in its circumferential direction or with relative angle patterns having dividing absolute angle ranges together with the code patterns formed thereon. A line sensor reads the code patterns and/or the relative angle patterns formed on the code plate in a circumferential direction. A high-order angle data generating means produces high-order angle data based on the code patterns read by the line sensor. For example, where the whole circumference of 360 degrees is sectioned at equal intervals of 10 degrees and the resultant angle ranges are represented by the BCD code notation having a digit in tens place and a digit in hundreds place respectively, code patterns indicative of "00" through "35" are provided and the high-order angle data generating means reads these BCD codes to produce high-order angle data (in hundreds and tens places) directly. A low-order angle data generating means generates low-order angle data on the basis of the distance between the reference position of the line sensor and a point at which each code pattern or each relative angle pattern is detected. As described above, where the whole circumference of 360 degrees is sectioned at equal intervals of 10 degrees and each resultant part is provided with code patterns, the code patterns applied to the individual sectors will be arranged at intervals of 10 degrees in a circumferential direction of the rotating disc. The distance between the reference position of the line sensor and a point at which a code pattern and a relative angle pattern is detected represents a low-order angle of smaller than 10 degrees. Thus, a low-order angle data is generated. It should be noted that it is possible to detect the distance between a specified point of each code pattern and the reference position of the line sensor (e.g. the left or right end thereof) if code patterns are provided in such a coding way that a specified point within each code pattern (e.g. the right or left end thereof). While, if such a coding way is not incorporated, relative angle patterns determining absolute angle ranges together with the code patterns are provided and low-order angles within an absolute angle range are obtained based on the distance between the reference position of the line sensor and a position at which a relative angle pattern is detected.

With the second feature of a rotary encoder according to the present invention, slits representative of codes indicative of absolute angles are formed in the rotating disc. Codes representative of specific angles are coded in a different way from codes of the other angles so that slits representative of codes of the specific angles are not made continuously long in an anglular direction of the slits.

FIG. 17 shows an example of codes provided on a code plate used in a rotary encoder according to the present invention. The example shown in FIG. 17 corresponds to the one shown in FIG. 24. In FIG. 17, angles having "0" in its ones place are defined as specific angles and are coded in a different way than that for the other angles. A flag bit as illustrated is used to distinguish these two coding ways from one another. A digit in hundreds place, a digit in tens place and a digit in ones place are expressed by three bits, four bits and four bits respectively. The codes of a specified angle is coded by shifting certain bits and by using complements of specified bits. As will be apparent from comparison with the example shown in FIG. 24, the slits indicative of digits in hundreds place are made discontinuous at intervals of 10 degrees. An angle data generating means generates angle data in response to output data of the optical sensor for reading these codes. With the example shown in FIG. 17, a reverse code conversion with respect to the code conversion in the foregoing is conducted on codes having a flag bit "1" so that angle data for the codes are obtained in the same way as the other codes.

BRIEF DESCRIPTION OF DRAWINGS

FIG. 17 is an example of codes provided on a code plate according to the present invention;

FIG. 20 is a diagram showing codes provided on the code plate and a coding way to obtain the codes;

FIG. 24 is an example of codes provided on a code plate used in a prior art rotary encoder.

EMBODIMENTS

Figure 1:
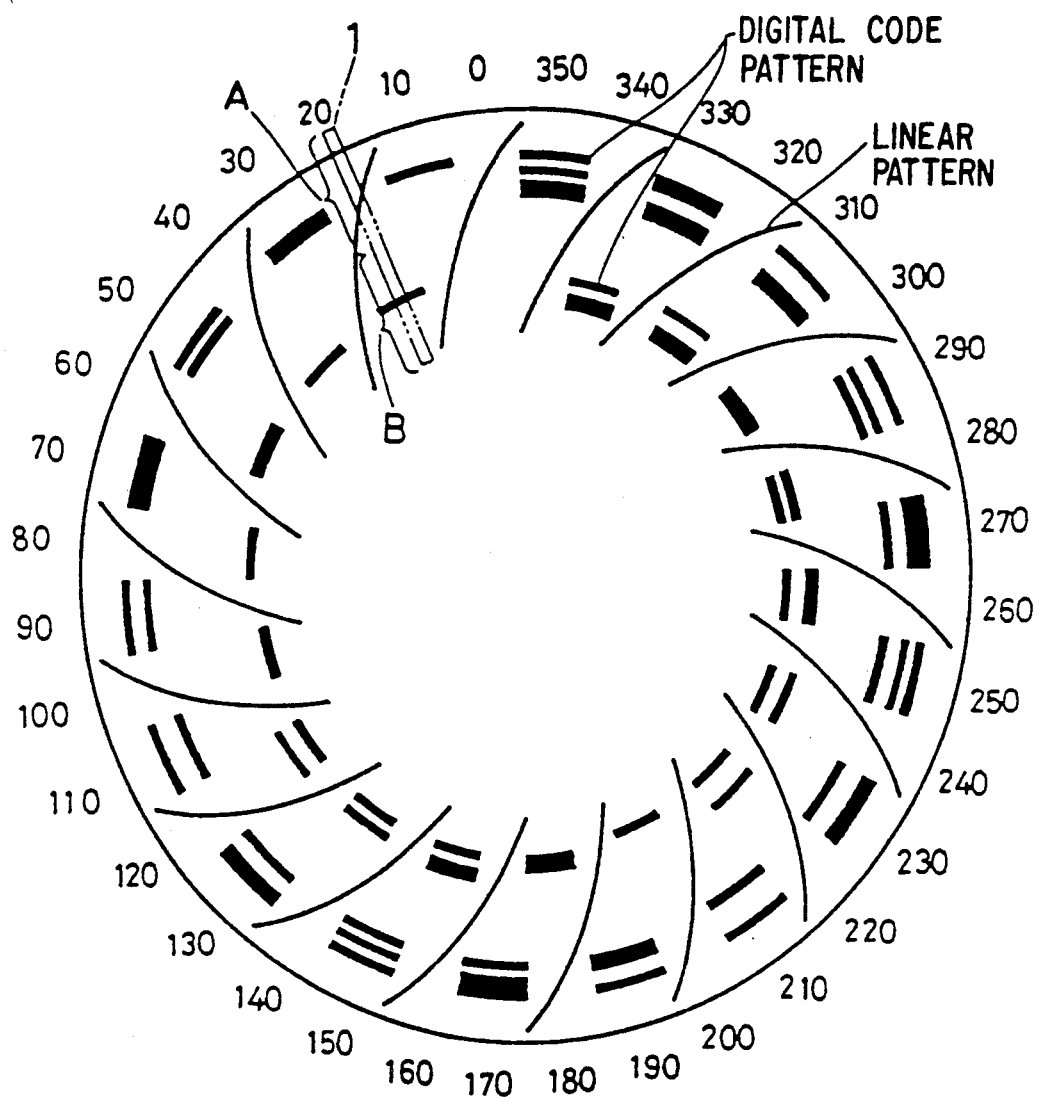
FIG. 1 is a plan view of a code plate used in an embodiment of a rotary encoder according to the present invention.
Figure 2:
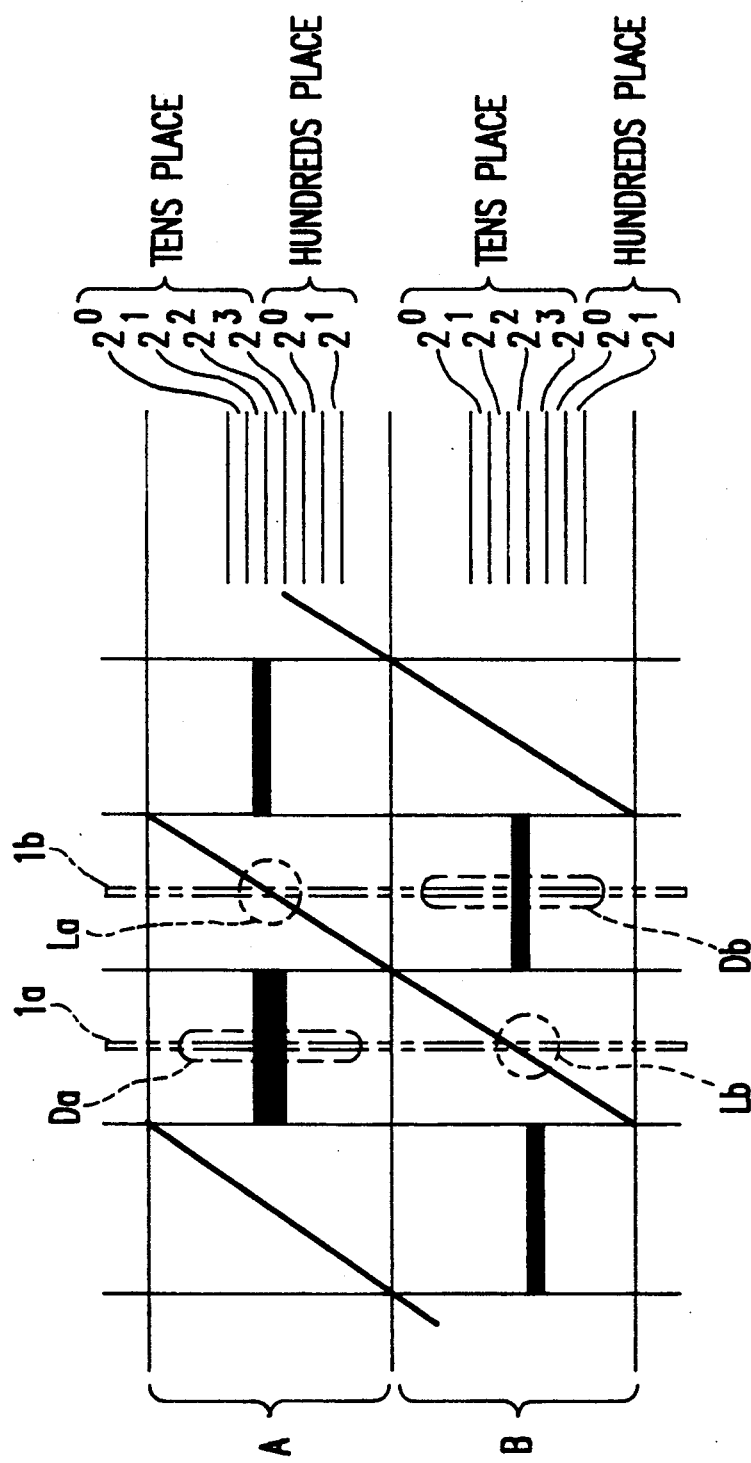
FIG. 2 is a developed view of a portion of the code plate.

FIG. 1 shows a code plate used in an embodiment of a rotary encoder according to the present invention. FIG. 2 shows a portion of patterns provided on the code plate. Referring to FIG. 1, each digital code is transformed into a pattern of slits arranged in the radial direction of a code plate, which indicates, in an angular range of 10 degrees, an absolute angle with a resolution of 10 degrees. These digital code patterns are formed at positions of different distances from the center of the code plate every angular range of 10 degrees, as shown. This arrangement prevents the slits representative of digital code patterns from being continuous in a circumferential direction and thus prevents the code plate from being bisected physically into an inner side portion and an outer side portion. A linear pattern represents relative angles in each absolute angle range and is provided in the form of a spiral slit which is inclined with respect to a radial direction. Letting "r" be a radius and "$\theta$" be an angle, this spiral curve is expressed by the following equation:

$$r = b + a\theta \quad (a, b: \text{constant})$$

In close proximity of the code plate provided with the digital code patterns and linear patterns formed therein, there is disposed a CCD line sensor for optically reading these patterns.

FIG. 2 shows a portion of the patterns formed in the code plate shown in FIG. 1 as developed in Cartesian coordinate system. The linear patterns will be straight lines. As illustrated, digital codes are coded in accordance with the BCD code system such that a digit in tens place of a rotating angle and a digit in hundreds place thereof are expressed by four bits and two bits respectively. Assuming that the CCD line sensor is at a position "1a", a digital code is obtained based on a signal corresponding to the digital code pattern specified by "Da" in the zone "A", and a relative angle is obtained based on an intersection "Lb" of a linear pattern formed in the zone "B" and the line sensor. When the CCD line sensor is at a position designated as "1b", a digital code representative of an absolute angle is obtained based on a signal corresponding to the digital code pattern specified by "Db" in the zone "B", and a relative angle is obtained based on an intersection "La" of a linear pattern formed in the zone "A" and the line sensor. It should be noted that the slit width of the linear pattern is made narrower than the slit width of one bit of the digital code pattern, and hence it is possible to discriminate whether an output signal of the CCD line sensor is caused to be produced by a linear pattern or by a digital code pattern on the basis of the width of an output signal of the line sensor. Accordingly, when a linear pattern is present in zone "B", a digital code is obtained in response to signals corresponding to the zone "A", whereas when a linear pattern is present in zone "A", a digital code is obtained on signals corresponding to the zone "B".

Provided that the numbers of dots of the CCD line sensor corresponding to the width of the zone "A" and the zone "B" are 500 respectively, the resolution obtained in relation to the linear pattern is 0.02 degree (= 10 degrees/500). If each of a digit in ones place, a digit in tenth place and a digit in one hundredth place is expressed by four bits, the low-order angle data can be expressed by twelve bits.

Figure 3:
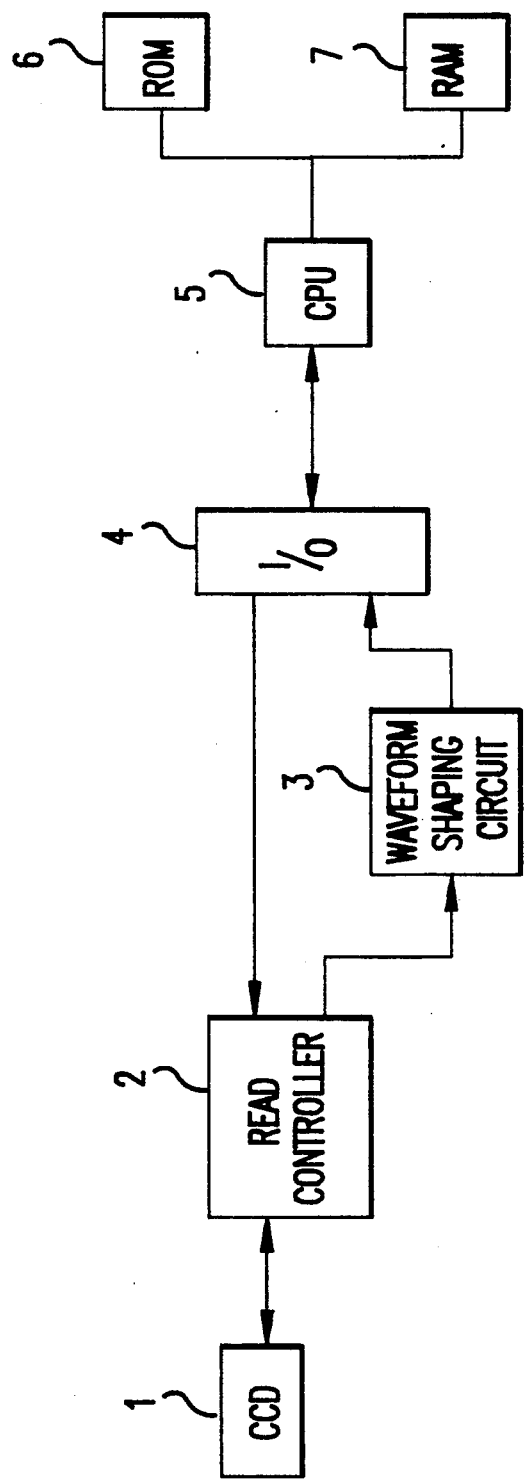
FIG. 3 is a block diagram of a control unit of the rotary encoder.
Figure 4:
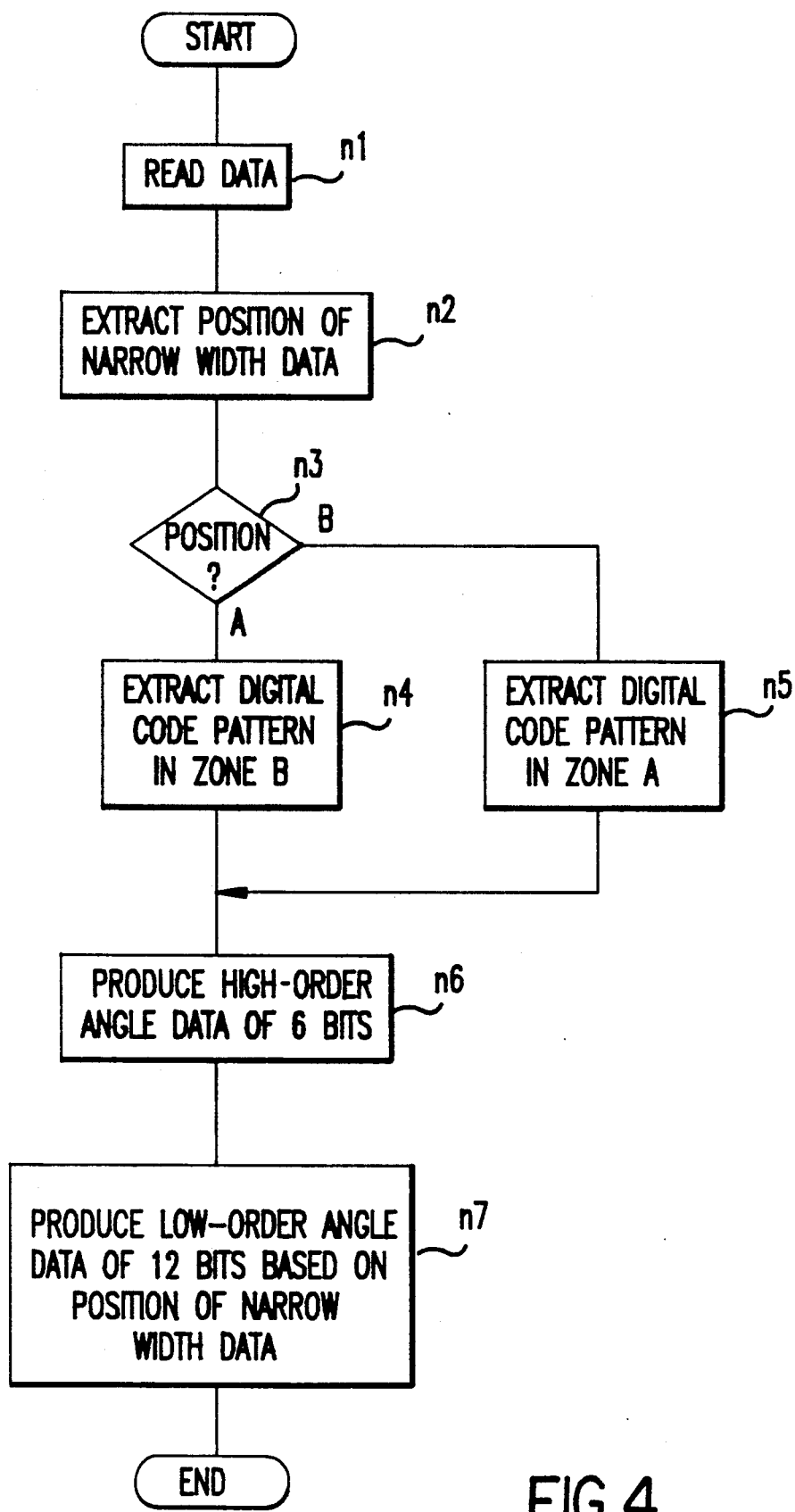
FIG. 4 is a flowchart showing the operation of the control unit.

FIG. 3 shows, in a block form, a control section for obtaining angles by using the code plate constructed as in the foregoing, and FIG. 4 shows, in a flowchart form, the operation of the control section. In FIG. 3, "1" represents a CCD line sensor comprising 1024 dots, and "2" is a read controller for controlling the incident light storage time and the read shifting operation of the sensor. A waveform shaping circuit 3 shapes the waveform of serial video signals as read. A CPU 5 supplies read instruction signals through an I/O interface 4 to the read controller 2 and causes the output signal of the waveform shaping circuit to be stored in a given area of a RAM 7. A ROM 6 stores programs therein to be executed by the CPU 5.

The CPU 5 operates in accordance with the sequence shown in FIG. 4. At first, video signals corresponding to one line and consisting of 1024 bits in a binary data form are stored in a given area of the RAM 7 (n1). Then, from the data thus stored, a position of intersection of the linear pattern with the line sensor is extracted (n2). When a position of intersection of the linear pattern with the line sensor is in the zone "A", a digital code pattern is extracted from data in relation to the zone B (n3→n4). Conversely, when a position of intersection of the linear pattern with the linear sensor is in the zone "B", a digital code pattern is extracted from data in relation to the zone "A" (n5). Then, from the thus extracted digital data pattern, a digital code comprising six bits (2 bits for a digit in hundreds place and 4 bits for a digit in tens place) representive of a high-order angle is produced (n6). Further, from the position of intersection of the linear pattern with the line sensor extracted at a step n2, a low-order angle data of 12 bits is produced (n7).

Figure 5:
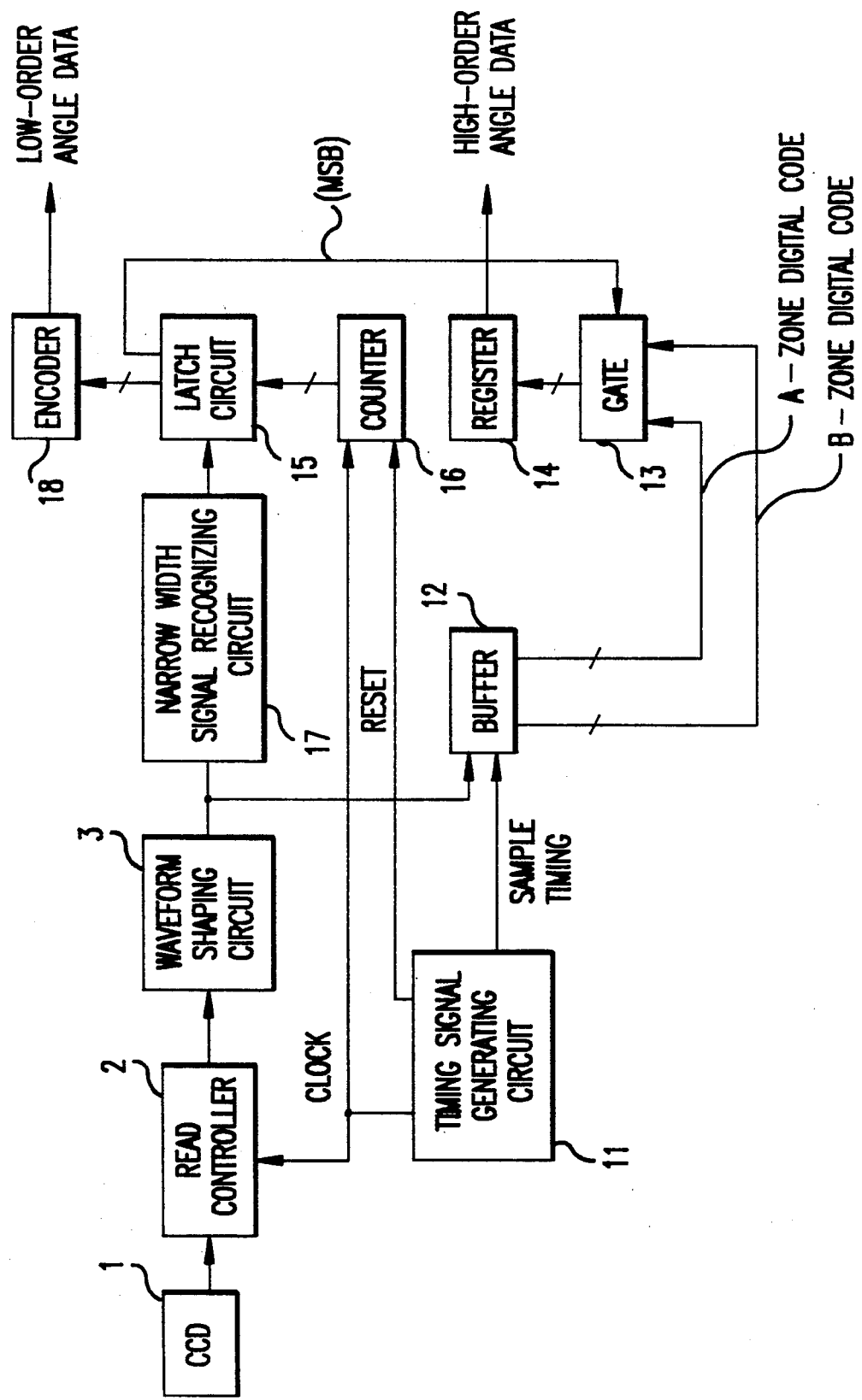
FIG. 5 is a block diagram of the control unit of another embodiment of a rotary encoder according to the present invention.

Although with the foregoing embodiment, output signals from the CCD line sensor are once stored in the memory unit and processed by means of a microprocessor, it is also possible to perform these processes by the use of a random logic unit as shown in FIG. 5. In FIG. 5, a narrow signal recognition circuit 17 derives a narrow signal corresponding to the linear pattern out of the signals obtained by shaping the output signals of the CCD line sensor 1 by means of the waveform shaping circuit 3, with the output signals of the CCD sensor being read by the read controller 2. A timing signal generating circuit 11 supplies timing signals to individual circuits, and a buffer 12 samples data corresponding to the one line of the CCD line sensor and stores therein the data in a form of predetermined number of bits. A counter 16 counts clock signals produced by the timing signal generating circuit 11. The timing signal generating circuit 11 resets the counter 16 at a time instant when the circuit 11 starts to read from the CCD line sensor data corresponding to the one line thereof. Thus, the counter 16 will perform counting operation to provide count values each indicating a present dot position of the CCD line sensor. When the rarrow signal recognition circuit 17 recognizes a narrow width signal, the latch circuit 15 latches a count output of the counter 16. Therefore, the data latched in the latch circuit 15 corresponds to the position of an intersection formed by the CCD line sensor and the linear pattern mutually intersected, and its most significant bit (MBS) indicates whether the linear pattern is present in the zone "A" or in the zone "B". An encoder 18 encodes a binary code except the most significant bit which is supplied from the latch circuit 15 to provide a low-order angle data having twelve bits in the BCD code system corresponding to a digit in ones place, a digit in tenth place and a digit in one hundredth place. A gate 13 supplied with both a digital code in the zone "A" and a digital code in the zone "B" from the buffer 12, selectively applies either digital code to a register 14 depending on the most significant bit (MBS) of the latch circuit 15. Thus, the register 14 produces a high-order angle data of six bits.

Although the code plate shown in FIGS. 1 and 2 is arranged such that a plurality of digital code patterns corresponding to integral multiples of 10 degrees are provided circumferentially in zigzag fashion as to define sectors at intervals of 10 degees and a plurality of linear patterns each covering a sector of an angle of 20 degrees are provided in gaps between adjacent digital code patterns, the adjacent digital code patterns and the adjacent linear patterns may be respectively and partially overlapped with each other circumferentially by a given angle, which will be shown hereinafter.

Figure 6:
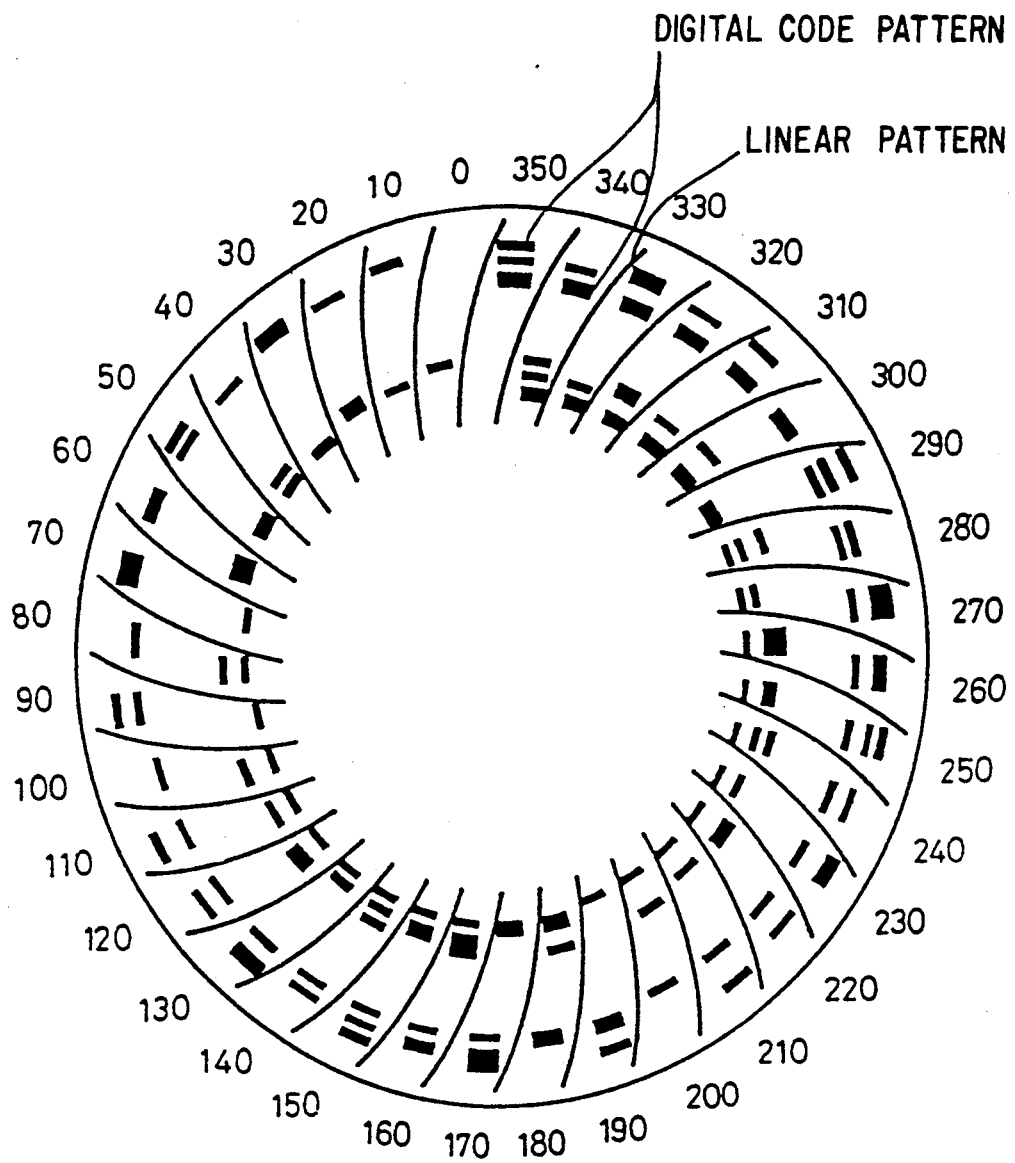
FIG. 6 is a plan view of another embodiment of the code plate.
Figure 7:
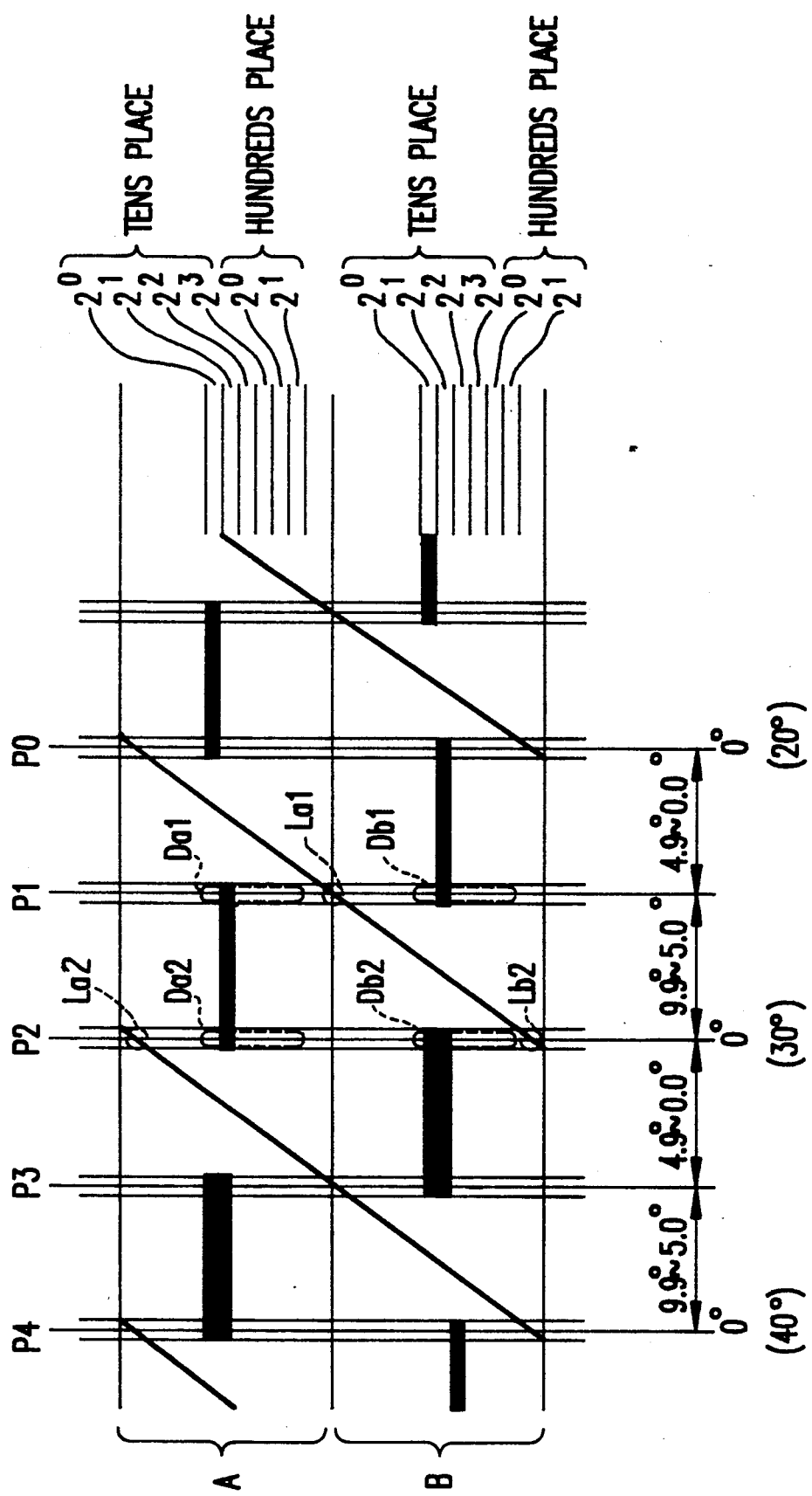
FIG. 7 is a developed view of a portion of the code plate in FIG. 6.

FIG. 6 shows a plan view of a code plate according to another embodiment of the present invention, and FIG. 7 shows a developed view of a portion of the code plate. As illustrated in these drawings, the digital code patterns are provided at intervals of 5 degrees and the linear patterns are provided at intervals of 10 degrees. Further, as illustrated in FIG. 7, the adjacent digital code patterns and the adjacent linear patterns are respectively and partially overlapped with each other by a given angle in boundary areas of two adjacent absolute angle ranges i.e., areas about zero degree or 5 degree in relative angles. For example, assuming that the sensor is moving relatively from a position P0 (20 degrees) toward a position P1 and then toward a position P2, a digital code pattern provided in the zone "B" is used during a time period the sensor lies midway between the position P0 and the position P1. When the sensor reaches the position P1, the three patterns designated by Da1, La1, and Db1 are read. After the low-order angle data based on the linear pattern becomes 5.0 degrees, the digital code pattern provided in the zone "A" is used. Thereafter, when the sensor reaches the position P2, the four patterns designated by La2, Da2, Db2, and Lb2 are read. After the low-order angle data based on the linear pattern provided in the zone "B" exceeds 9.9 degrees, angles are obtained on the basis of the linear pattern provided in the zone "A" and the digital code pattern provided in the zone "B". In this way, the adjacent digital code patterns and the adjacent linear patterns are respectively and partially overlapped with each other every 5 degrees, and the digital code pattern and the linear pattern are replaced with others respectively each time the low-order angle based on the linear pattern exceeds 4.9 degrees or 9.9 degrees, whereby false readings in the discontinuous areas of each type of the patterns can be eliminated.

Figure 8:
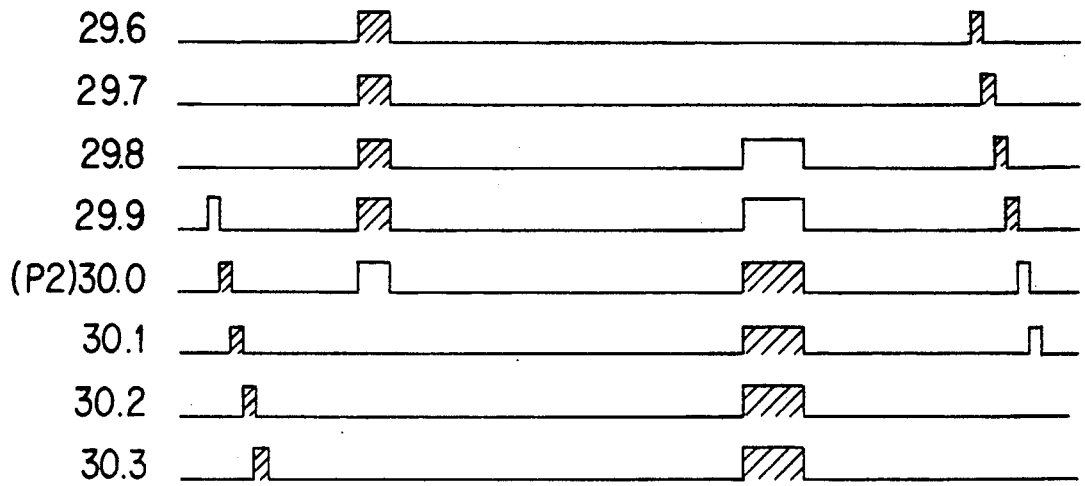
FIGS. 8 and 9 are waveform diagrams of output signals of a sensor.
Figure 9:
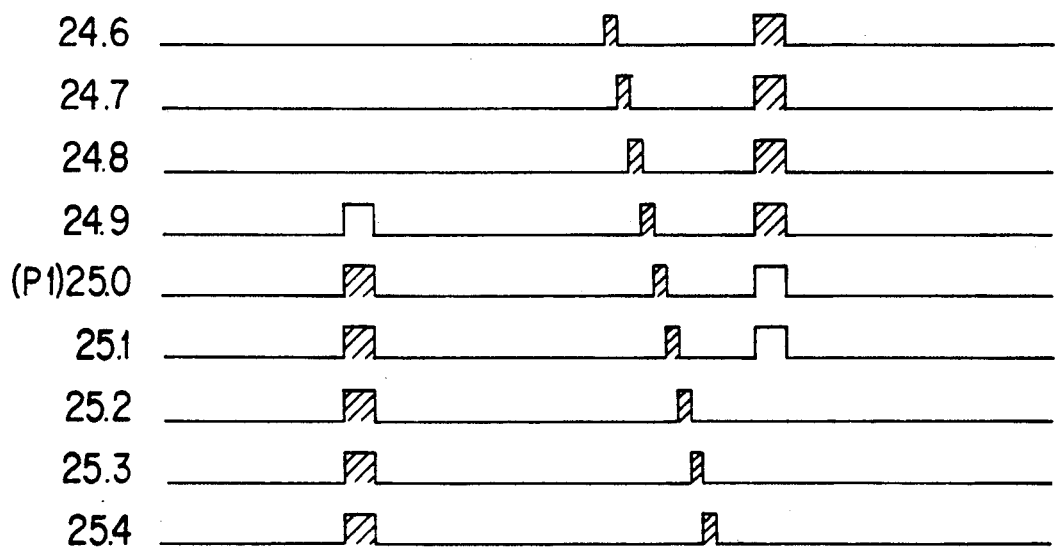

FIGS. 8 and 9 show output signals of the CCD line sensor as a result of the rotation of the code plate. FIG. 8 shows a transitional state at the position P2 in FIG. 7, and FIG. 9 shows a transitional state at the position P1 in FIG. 7. It should be noted that in these drawings, the resolution based on the linear pattern is set to 0.1 degree. In FIG. 8, narrow pulses are caused to be produced by the linear pattern, and the other pulses are caused by the digital code pattern. Further, pulses appearing in the former part (left-hand side) in the drawings are caused to be produced by the patterns provided in the zone "A", and pulses appearing in the latter portion (right-hand side) are caused by the patterns provided in the zone "B" (it should be noted that the CCD line sensor performs scanning in a direction from the zone-A to zone-B). Although some pulses due to the overlapped portions of the patterns simultaneously apperar around 30.0 degrees, a switching operation is made to replace signals of a group with signals of the other group at 29.9 degrees and at 30.0 degrees as illustrated by the shaded pulses. Similarly, in FIG. 9, pulses of narrow width are caused to be produced by the linear pattern, wide pulses appearing at a right-hand side on the lines of 24.6 degrees through 25.1 degrees are caused by the digital code pattern provided in the zone "B", and pulses appearing at the left-hand side on the lines of 24.9 degrees through 25.4 degrees are caused by the digital code pattern provided in the zone "A". Thus, although pulses due to the two digital code patterns simultaneously appear around 25.0 degrees, signal switching is performed at the 24.9 degrees and 25.0 degrees to provide signals resulting from another code pattern, as illustrated by the shaded pulses.

Such signal switching can be done in the same way as in the foregoing embodiment to provide angle data by making narrow pulses falling in the low-order angle range of 0.0 degree through 9.9 degree alone valid when these pulses are derived from a memory which has stored the output signals of the sensor.

It should be noted that although the digital code patterns and linear patterns are embodied in the form of slits in the foregoing embodiments, they may be provided on the surface of the disc in a form of optical patterns. Further, the patterns can be read in a way to detect passing light as well as in a way to detect reflected light.

As described above, according to the present invention, an absolute angle of a defined sector of the code plate in which a digital code pattern is formed can be obtained on the basis of the digital code pattern with a resolution corresponding to the number of bits of the pattern, and a relative angle in the absolute angle range can be obtained on the basis of each linear pattern with finer resolution. Since each linear pattern is provided in a narrow space between adjacent absolute angle spans, the rotational angle can be detected with high resolution substantially uniformly over the whole circumference even where the preciseness of each pattern is not so high.

Further, since the digital code patterns and the linear patterns are respectively and partially overlapped with each other in boundary areas between adjacent absolute angle ranges, no false readings by the sensor in the boundary areas occur even where the preciseness of the patterns provided on the code plate and the accuracy of attachment of the sensor are not so high.

Another embodiment of a rotary encoder according to the present invention will be explained with reference to FIG. 10 through FIG. 16.

Figure 10:
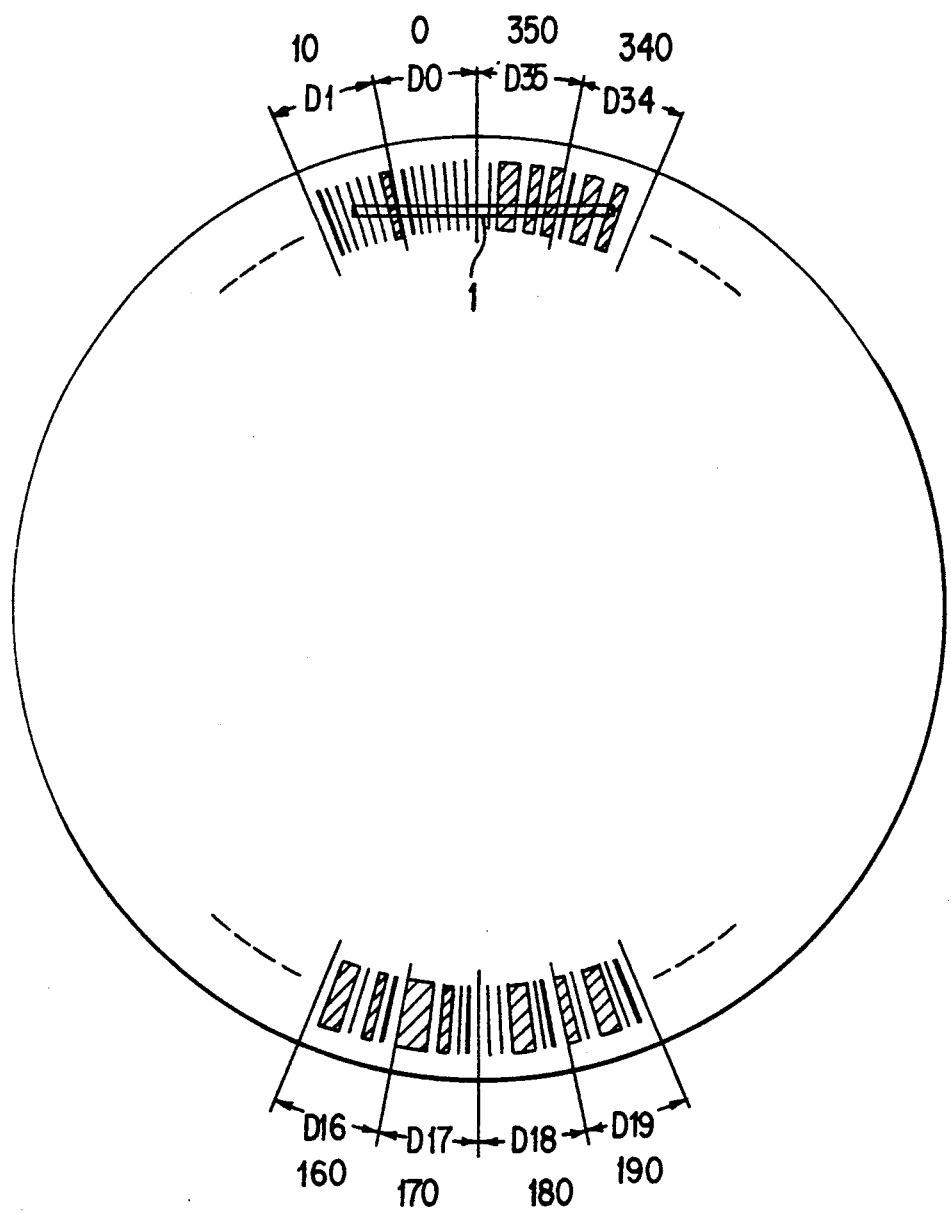
FIG. 10 is a plan view of a still another embodiment of the code plate.
Figure 11:
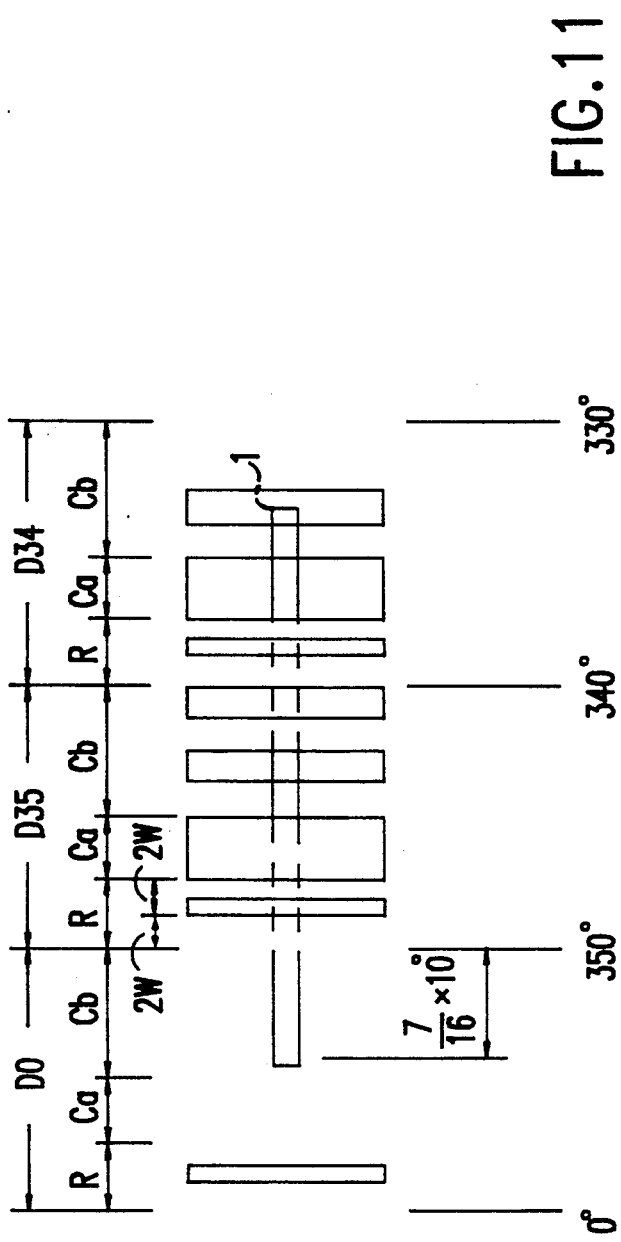
FIG. 11 is a developed view of a portion of the code plate shown in FIG. 10.

FIG. 10 shows a code plate, and FIG. 11 shows a portion of the patterns provided on the code plate. In FIG. 10, D0, D1, . . . D16 through D19, . . . D34 and D35 are respectively patterns provided in individual sectors of 10 degrees each arranged along the circumference of 360 degrees. "1" designates the read area of the CCD line sensor. High-order angle data corresponding to an integral multiple of 10 degrees and low-order angle data of smaller than 10 degrees are produced on the basis of read signals from the CCD line sensor as described later. Roughly speaking, the patterns D0, D1, D16, D17 and D35 correspond to the angle ranges of 0 degree, 10 degrees, 160 degrees, 170 degrees and 350 degrees, respectively.

FIG. 11 shows some patterns provided on the code plate in FIG. 10 that are developed in a rectangular X-Y coordinate system. Although the area read by the CCD line sensor is not straight, it is shown as being straight for descriptive purposes. As illustrated, each sector of D0, D35, D34 is composed of a relative angle pattern "R" indicative of relative angles and code pattern halves "Ca" and "Cb" indicative of an absolute angle span. Each sector of D0, D35, D34 has 8 positions. Letting the width of one position be "2W", the relative angle implying pattern "R" is composed of a blank of "2W", a slit of "W", and another blank of "W". The pattern halves "Ca" and "Cb" in combination represent "0" through "35" in the BCD code system, the one half "Ca" is of 2 bits corresponding to tens place (hundreds place in angular notation), the other half Cb is of 4 bits corresponding to ones place (tens place in angular notation), and each bit is expressed by the presence or absence of a slit of 2W. High-order angle data are obtained by reading the code pattern halves "Ca" and "Cb" subsequent to the pattern "R" as will be described hereinafter.

The low-order angle data is obtained on the basis of the distance between the left end of the CCD line sensor and the left end of the relative angle implying pattern "R". That is, with the example of FIG. 11, the distance between the left end of the read area 1 of the CCD line sensor and the left end of the first relative angle implying pattern "R" is "7W". Since the "W" is (1/16) times 10 degrees, a low-order angle data is obtained as (7/16) times 10 degrees.

Means for producing the high-order angle data and the low-order angle data on the basis of the output signals of the CCD line sensor will be described.

Figure 12:
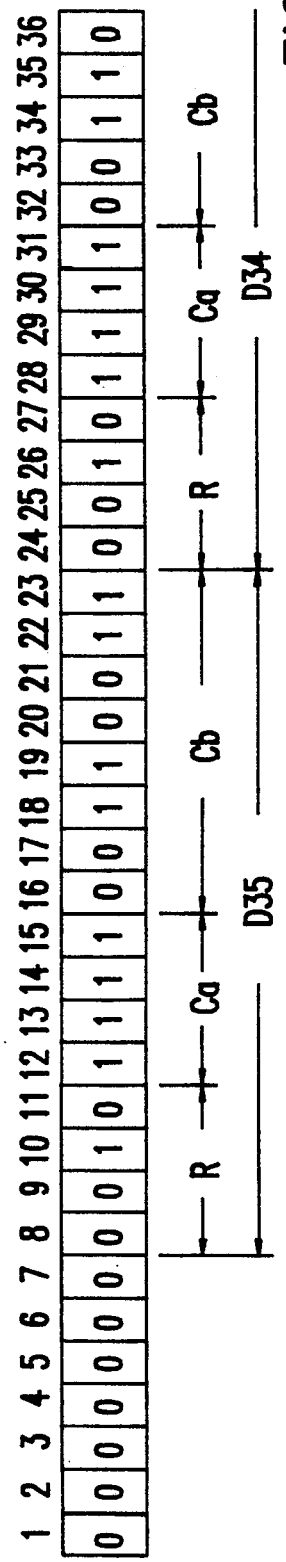
FIGS. 12 and 13 are diagrams showing a data content in a portion of the control unit and the whole construction thereof respectively.
Figure 13:
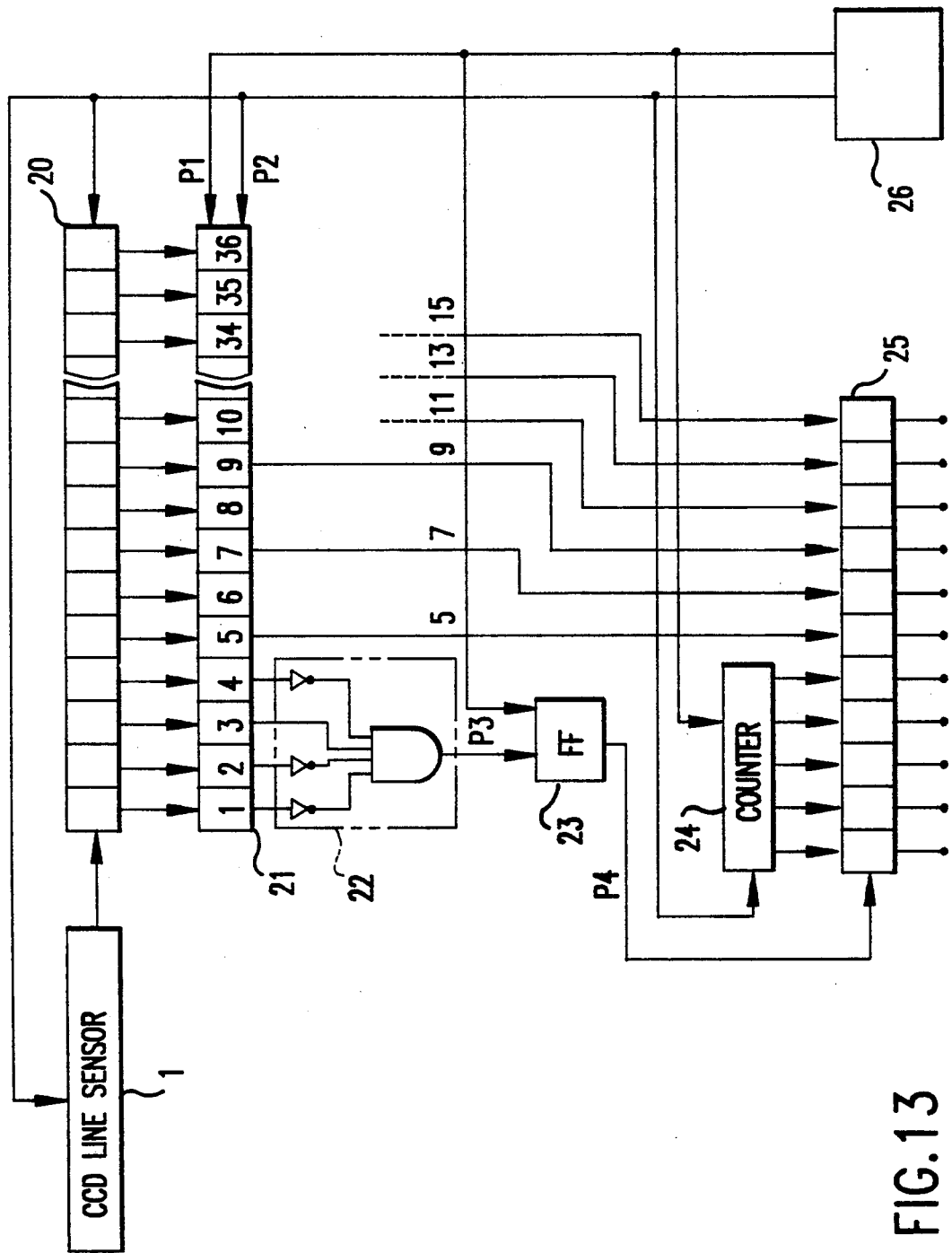
Figure 14:
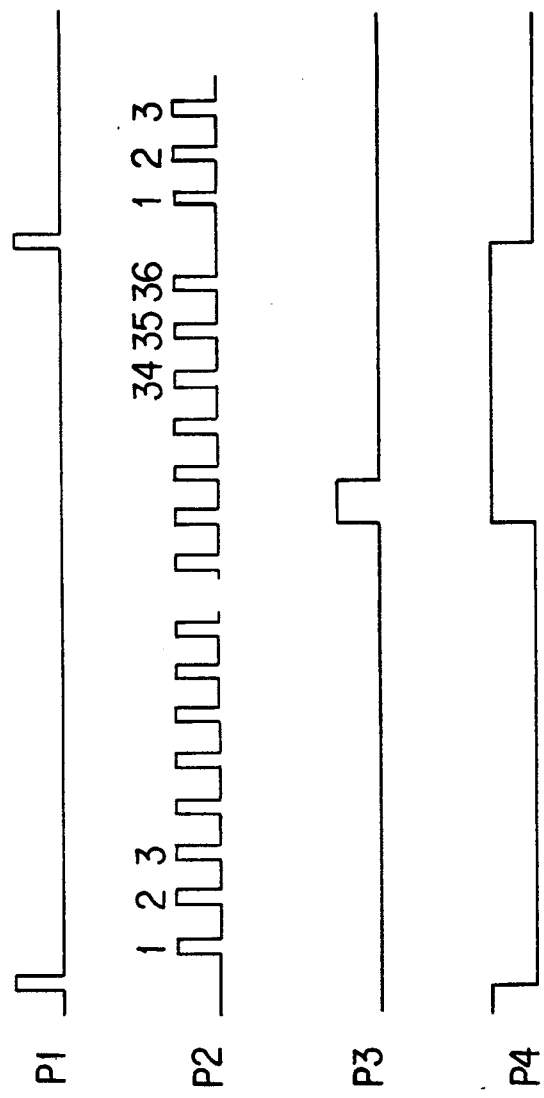
FIG. 14 is a timing chart showing the operation of the control unit.

FIG. 13 shows a block diagram of a control section for obtaining angles on the basis of the code plate shown in FIGS. 10 and 11. In this drawing, "20" and "21" are shift registers of 36 bits each; "22" is a circuit for detecting relative angle patterns; "23" is a flip-flop; "24" is a counter; "25" is a latch circuit; and "26" is a timing circuit for applying timing signals to individual circuits. The timing circuit 26 starts its operation at a time instant when power supply is turned on to deliver signals P1 and P2 as shown in FIG. 14. In response to the timing signals P2, the CCD line sensor 1 and the shift register 20 send the video signal data of one line to the shift register 20. The flip-flop 23 and the counter 24 are reset to be in an initial condition in response to the signal P1, and the shift register 21 latches the content of the shift register 20 at a time instant when the signal P1 is produced. If the read area of the CCD line sensor is as illustrated in FIG. 11, the data thus latched is as shown in FIG. 12. Sectors of D35, D34 and so on correspond to the counterparts as shown in FIG. 11 respectively. In response to the timing signals P2, the content of the CCD line sensor 1 is sent to the shift register 20 bit by bit and at the same time, the content of the shift register 21 is shifted leftward bit by bit. The counter 24 counts the signals P2. The relative angle pattern detecting circuit 22 sets the flip-flop 23 when the input data of 4 bits to the circuit 22 becomes "0010" (see signals P3 and P4 in FIG. 14). In response to the signal, the latch circuit 25 latches the content of the counter 24 and the output signals of memory elements 5, 7, 9, 11, 13 and 15 of the shift register 21. Consequently, the latch circuit 25 holds the data corresponding to the distance between the left end of the read area of the CCD line sensor and the left end of the relative angle implying pattern in its five high-order bit positions, and holds the data in BCD notation representing a digit in hundreds place and a digit in tens place of an angle in its six low-order bit positions.

Figure 15:
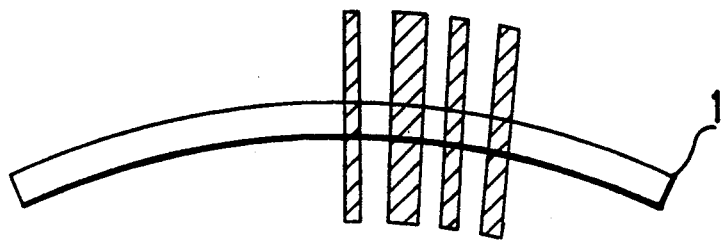
FIGS. 15 and 16 are diagrams showing examples of modified patterns formed in the code plate.
Figure 16:
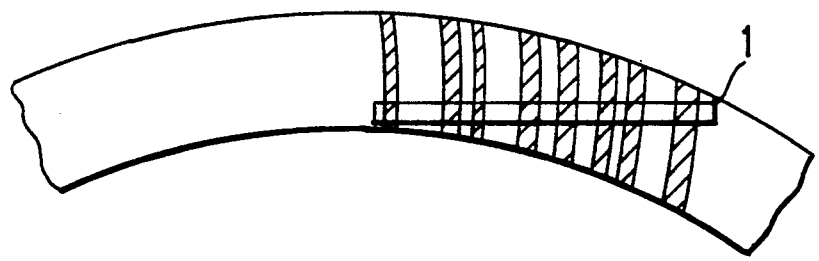

Incidentally, where the CCD line sensor is arranged on a straight line as shown in FIG. 10, the movement of the patterns with respect to the CCD line sensor is not along a straight line, since the patterns provided on the code plate undergo rotational motion. Therefore, to ensure a given accuracy, it is necessary to compensate for such non-linearity. For such purposes, for example, the CCD line sensor may be curved to be in parallel with the circumference of the rotating disc as shown in FIG. 15, or the pattern may be modified as to have a given curvature as shown in FIG. 16. Further, signal processing can also be employed for the compensation such that the content of the CCD line sensor is read out at a non-linearly varying speed.

Although with the foregoing embodiments, the digital code patterns and linear patterns are provided in the form of slits, they may be provided on the surface of the disc in the form of optical patterns. Further, the patterns can be read in a way to detect reflected light as well as in a way to detect passing light.

With the second embodiment of the present invention in the foregoing, the resolution can be readily enhanced by increasing the density of pattern formation in correspondence to the spacing between adjacent light-receiving elements of the line sensor, since the line sensor successively reads the patterns moving in a circumferential direction of the code plate.

Figure 18:
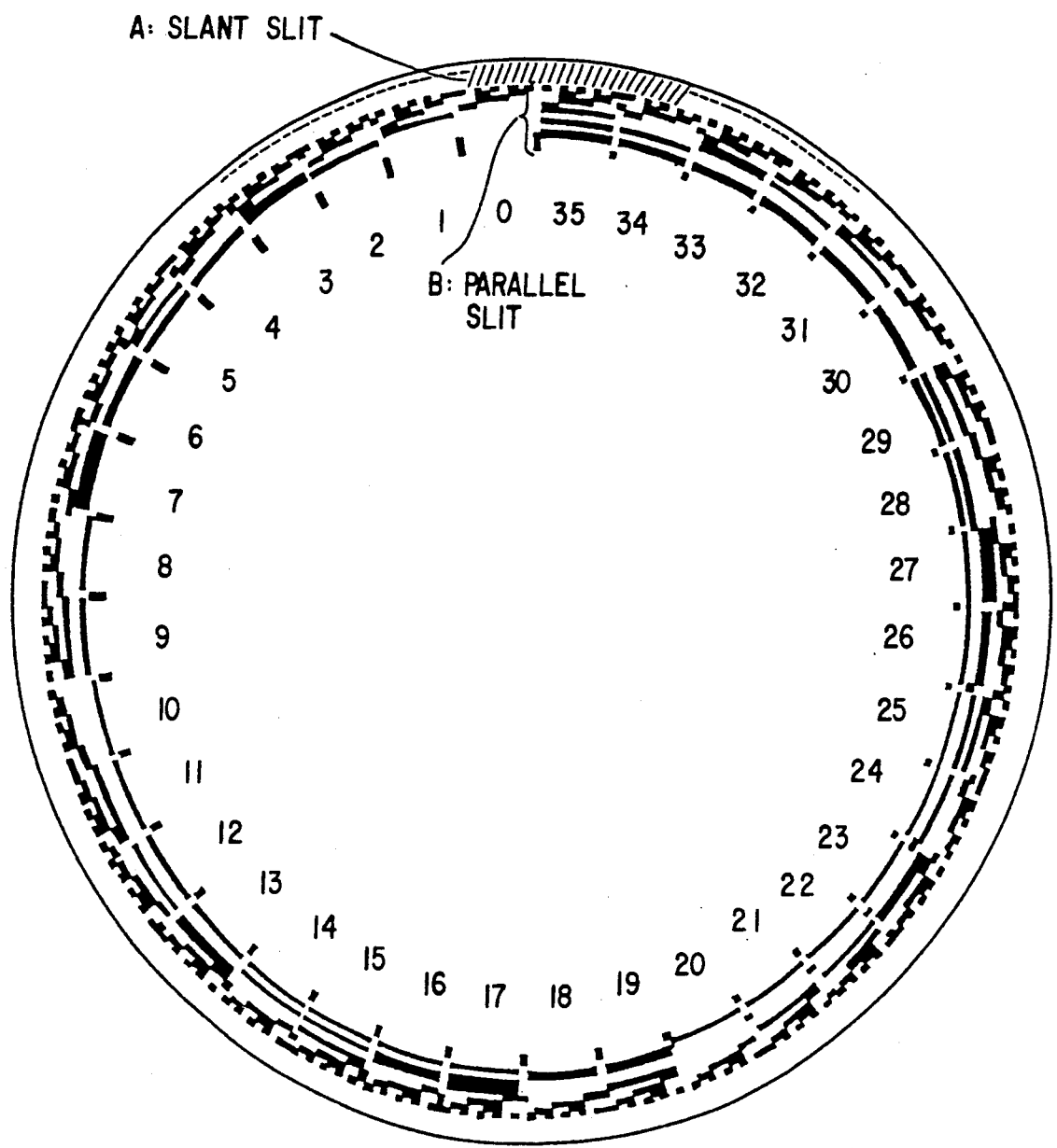
FIG. 18 is a plan view of a code plate used in another embodiment of a rotary encoder according to the present invention.
Figure 19:
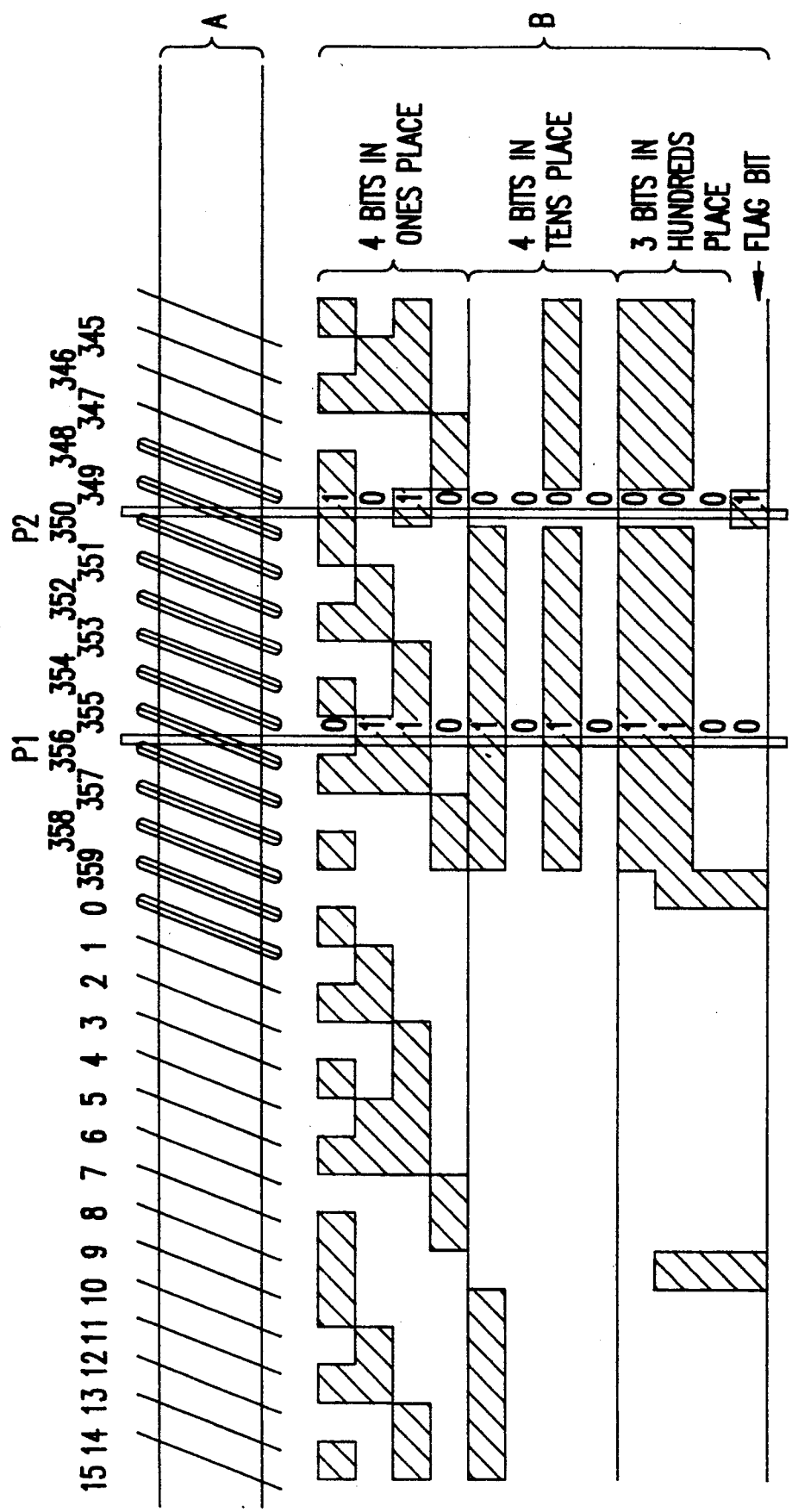
FIG. 19 is a developed view of a portion of the code plate shown in FIG. 18.

FIG. 18 shows a code plate used in another embodiment of a rotary encoder according to the present invention; FIG. 19 shows a portion of the code patterns provided on the code plate; and FIG. 20 shows relationship between angles and corresponding codes.

Referring to FIG. 18, a zone "A" has straight slits formed therein which are inclined with respect to the radial direction of the code plate. The zone "A" is used to obtain a resolution smaller than one degree. A zone "B" has slits formed therein which represent digital codes representing absolute angles each with a resolution of one degree. The numerals of "0" through "35" as illustrated indicate discrete absolute angles with the unit digits omitted.

FIG. 19 shows the codes illustrated in FIG. 18 which are linearly developed. As illustrated, each digital code is coded and expressed by twelve bits in such a way that the most significant bit is used as a flag bit, and a digit in hundreds place is expressed by three bits, a digit in tens place is expressed by four bits, and a digit in ones place by four bits. Each shaded spot corresponds to bit "1", and thus, a corresponding slit is formed there. When the optical sensor is at a position P1 (356 degrees), "001101010110" is read, or when it is at a position P2 (350 degrees), "100000000101" is read. Each oblique slit formed in the zone "A" is inclined over a width of one degree with respect to the optical sensor. Therefore, a relative angle can be detected with a resolution of smaller than one degree, depending on a position of the optical sensor for receiving light.

Let a code of twelve bits be expressed by $X_0$ through $X_{11}$ as shown in FIG. 20. Where the flag $X_{11}$ is "0", angles are coded in BCD notation as shown. Where the $X_{11}$ is "1", $X_0$ through $X_{10}$ are coded as in the following. That is, for example, an angle of 350 degrees is "01101010000" in BCD notation as parenthesized in FIG. 20. To code this, the complements of bits $X_9$ and $X_8$ are shifted to positions of $X_{10}$ and $X_9$, respectively, and bits $X_4$ through $X_7$ are shifted to positions of $X_0$ through $X_3$, respectively. By performing such coding operations every 10 degrees, there are obtained coded patterns such that slits are not continuously formed extending in a circumferential direction a sector of an angle more than a given angle.

Figure 21:
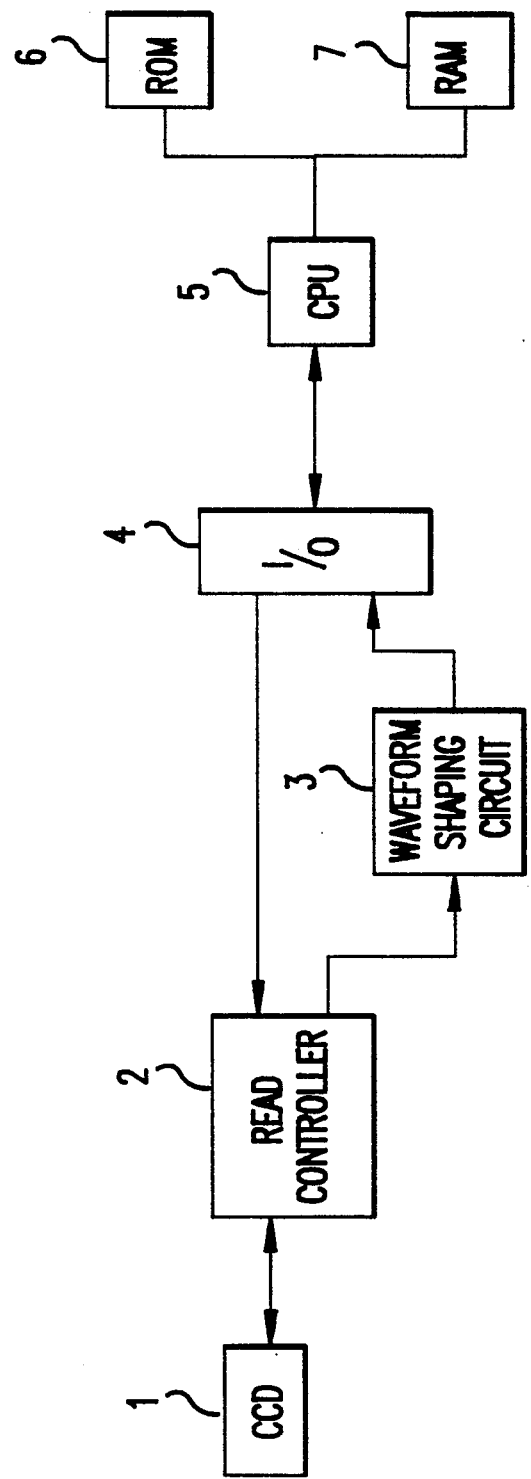
FIG. 21 is a block diagram of a control unit of a rotary encoder.
Figure 22:
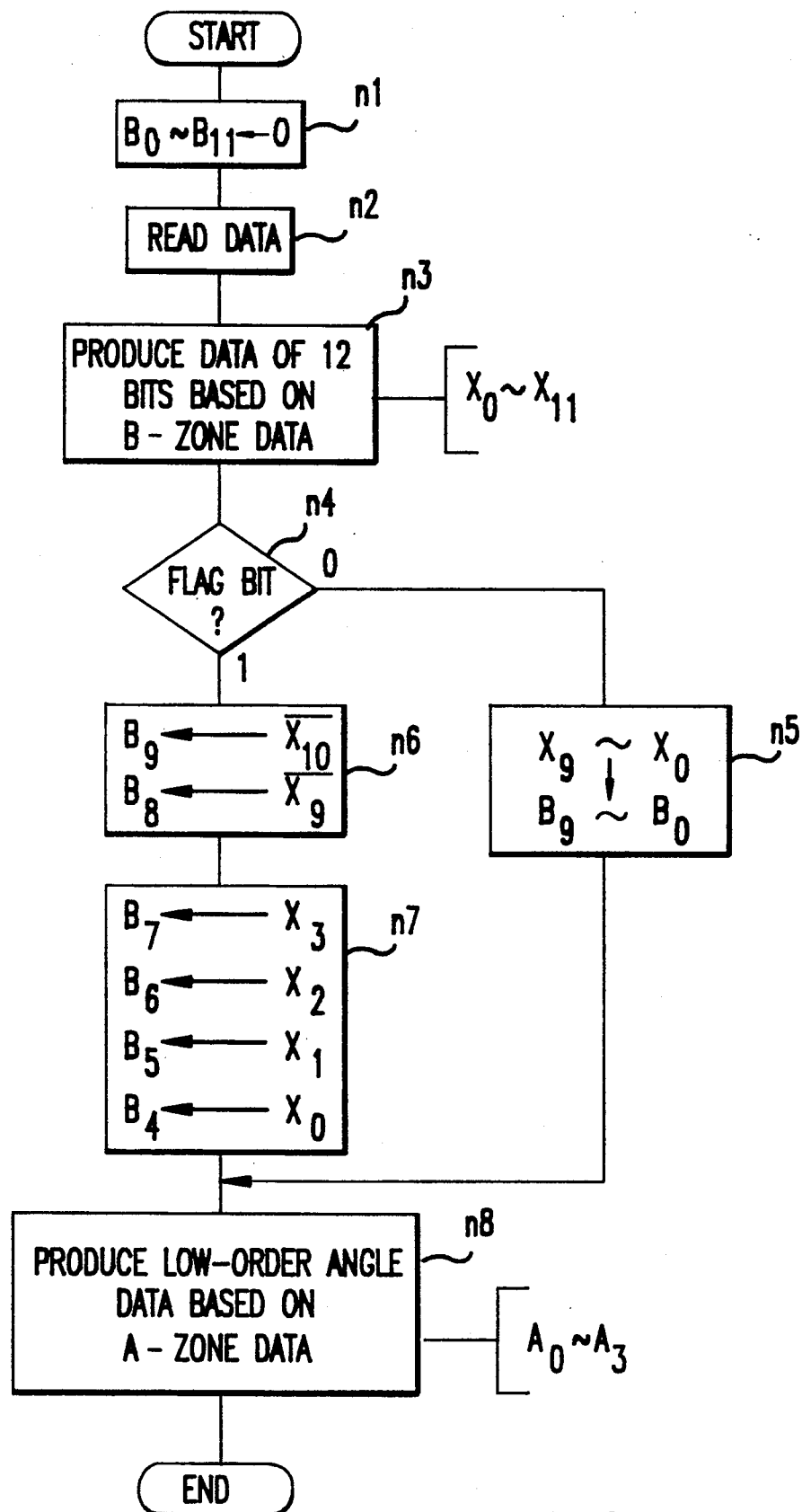
FIG. 22 is a flowchart showing the operation of the control unit.

FIG. 21 shows a block diagram of a control section for obtaining absolute angles by using the code plate arranged as in the foregoing, and FIG. 22 shows a flowchart showing the operation of the control section. In FIG. 21, "1" represents the CCD line sensor having 1024 dots, and "2" is the read controller for controlling the incident light storage time and the read shifting operation of the sensor. The waveform shaping circuit 3 shapes the waveforms of video signals as serially read. The CPU 5 supplies the read instruction signals through the I/O interface 4 to the read controller 2 and causes the output signals of the waveform shaping circuit 3 to be stored in a given area of the RAM 7. The ROM 6 stores therein programs to be executed by the CPU 5.

The CPU 5 operates in accordance with the sequence of operations shown in FIG. 22. In this drawing, symbols $B_0$ through $B_{11}$ designate buffers for producing BCD codes representative of an angle with a resolution of one degree, $X_0$ through $X_{11}$ designate buffers for producing a code consisting of twelve bits based on the shaped output signals of the read controller and storing it therein, and $A_0$ through $A_3$ designate buffers consisting of 4 bits for obtaining an angle data with a resolution of smaller than one degree based on the data in the zone "A" on the code plate. Angle data are obtained using these buffers in the following way. At first, the buffers $B_0$ through $B_{11}$ are cleared (n1). Then, the read instruction signal is applied to the read controller 2 to read the data of one line (n2). A code consisting of twelve bits is produced in the buffers $X_0$ through $X_{11}$ based on the data resulting from the zone "B" out of the data thus read (n3). The condition of the flag bit $X_{11}$ is checked (n4). When the flag bit is "0", ten low-order bit signals in the buffer X are shifted to ten low-order bit elements of the buffer B (n5), whereby a BCD code having a digit of degree in ones place is stored in the buffer B. Then, angle data of 4 bits with a resolution of smaller than one degree is produced from the data in the zone "A" out of the data read at the step n2 and stored in the buffer "A" (n8). Actually, such fine resolution is attained by encoding a bit "1" of each of the data of hundreds of bits (dots) in the zone "A" into 4 bits. When the flag bit is "1" in a check step n4, bits $X_{10}$ and $X_9$ are inverted and shifted to the positions of $B_9$ and $B_8$ (n6). Then, bits $X_0$ through $X_3$ are shifted to the positions of $B_4$ through $B_7$ without any modifications (n7). Then, in the way to the case of the flag bit being "0", 4-bit data representative of an angle smaller than one degree are produced based on the data in the zone "A" and stored in the buffers $A_0$ through $A_3$ (n8).

Figure 23:
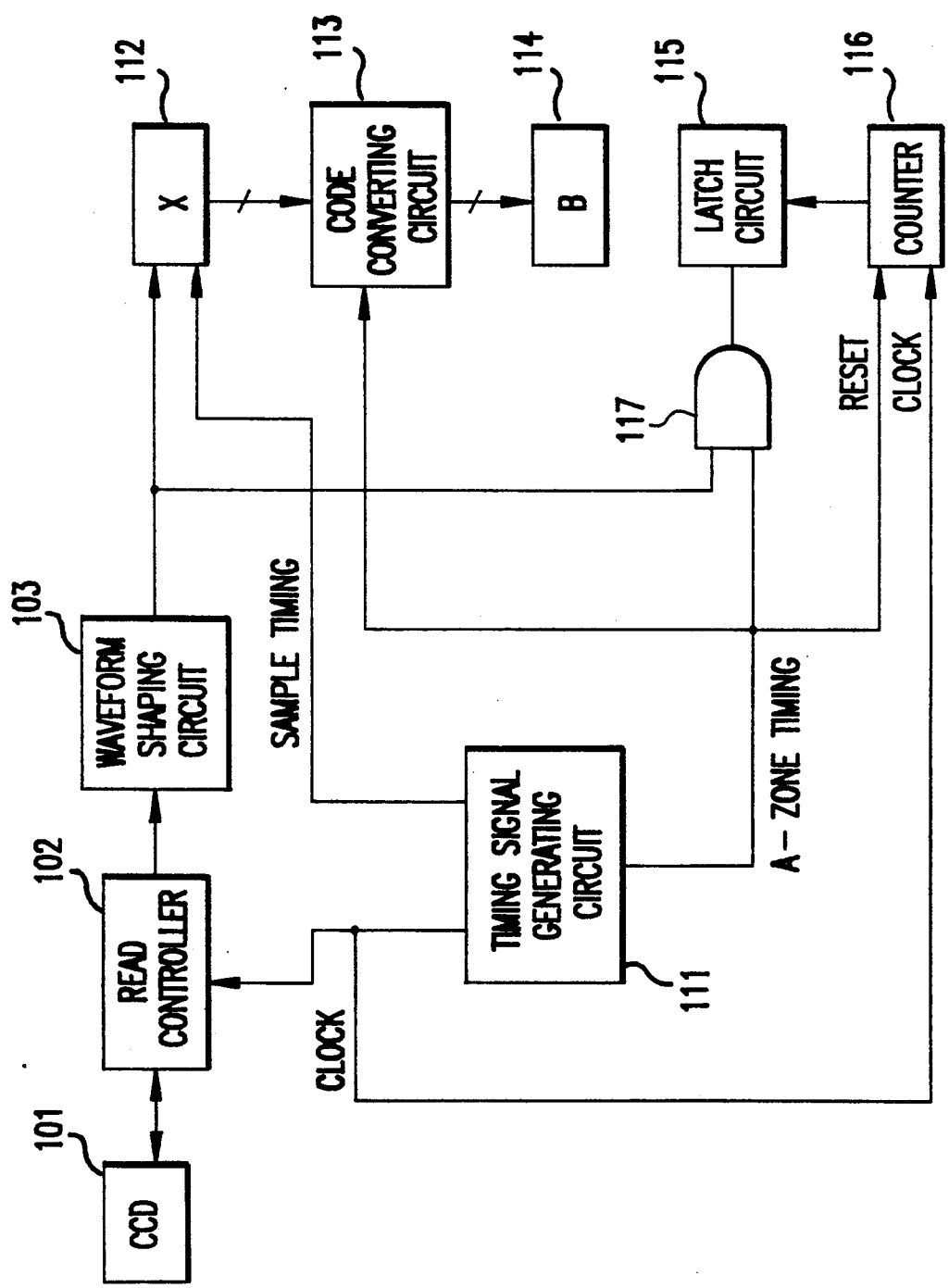
FIG. 23 is a block diagram of the control unit of another embodiment of a rotary encoder.

Although with the foregoing embodiment, output signals of the CCD line sensor are once stored in a memory unit and are processed by using a microprocessor, it is also possible to perform the signal process by using a random logic circuit as shown in FIG. 23. In FIG. 23, a buffer 112 receives serially at predetermined timing signals resulting from signals which are produced by the CCD line sensor 101 and are read by a read controller 102 and are shaped in waveform by a waveform shaping circuit 103. A code converting circuit 113 performs code conversion when twelve bits of data in relation to the zone "B" out of the data of one line is applied to the buffer 112, and writes 12-bit angle data with a unit of one degree into a register "B". The logic of the code converting circuit 113 is as follows:

$B_0 = \overline{X_{11}} \cdot X_0$ $B_1 = \overline{X_{11}} \cdot X_1$ $B_2 = \overline{X_{11}} \cdot X_2$ $B_3 = \overline{X_{11}} \cdot X_3$ $B_4 = \overline{X_{11}} \cdot X_4 + X_{11} \cdot X_0$ $B_5 = \overline{X_{11}} \cdot X_5 + X_{11} \cdot X_1$ $B_6 = \overline{X_{11}} \cdot X_6 + X_{11} \cdot X_2$ $B_7 = \overline{X_{11}} \cdot X_7 + X_{11} \cdot X_3$ $B_8 = \overline{X_{11}} \cdot X_8 + X_{11} \cdot \overline{X_9}$ $B_9 = \overline{X_{11}} \cdot X_9 + X_{11} \cdot \overline{X_{10}}$ $B_{10} = 0$ A counter 116 performs its counting operation in response to an output signal from a timing signal generating circuit 111. That is, while a zone-A timing signal is generated from the timing signal generating circuit 111, the counter 116 is released from the reset condition to count clock signals. A latch circuit 115 latches data corresponding to given high-order bits of the counter 116, when the output signal of an AND gate 117 is "H". Thus, data corresponding to the oblique slit in the zone "A" out of the output signals of the CCD line sensor are latched in the latch circuit 115. In this way, angle data with a resolution of one degree are obtained in the register "B", and angle data with a resolution of smaller than one degree are obtained in the latch circuit 115.

Figure 25:
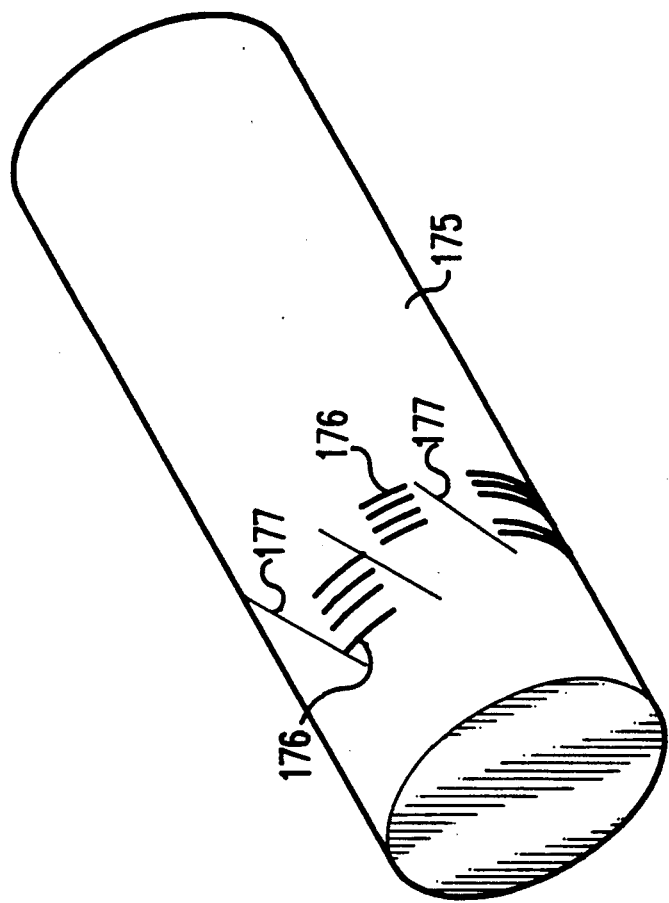
FIG. 25 illustrates a code cylinder in accordance with the invention.

FIG. 25 illustrates a further embodiment of the invention wherein the code carrying body is a rotatable cylindrical body 175 having a plurality of digital code patterns on its surface. The digital code patterns are comprised of circumferentially distributed blocks 176 of patterns, with the patterns of each of the blocks being circumferentially displaced with respect to the pattern of the adjacent blocks. In addition, a plurality of linear patterns 178 are provided that are indicative of a relative angle and are inclined with respect to the axial direction of the rotating body.

As described above, according to the present invention, the patterns are made such that each of the code bits is the same in an angular direction within a sector of a given angle and not the same in areas outside the sector as that in the sector. As a result, even when an opaque plate is used as the code plate and slits representative of codes are formed in the plate, the code plate is never separated into parts along a succession of such slits. Therefore, it is possible to enhance the accuracy in reading the code patterns, since light is not reflected nor refracted as opposed to the case in which the code plate is made of a transparent material, such as glass or transparent resin. Further, the code patterns can be readily provided.

Although with the foregoing embodiments of the present invention, various patterns are provided on a rotating disc, the present invention should not be limited to the rotating disc. The same effects as those brought about by the foregoing embodiments can also be obtained even where various patterns as shown in FIGS. 2, 7, 11 and 19 are provided on the surface of a rotating body of, for example, cylindrical shape. Further, the same effects as above can also be obtained even where various patterns are provided on the surface of a rotating body of conical shape.

We claim:

1. A rotary encoder comprising:
   a rotating body provided on its surface with a plurality of absolute angle patterns indicative of absolute angle ranges and a plurality of relative angle patterns indicative of relative angles;
   said absolute angle pattern being comprised of a plurality of circumferentially spaced pattern blocks with the patterns of each block not being contiguous with the patterns of each block adjacent thereto; said relative angle pattern comprising inclined lines extending in regions radially overlapped with said absolute angle patterns;
   means for sensing said patterns;
   high-order angle data producing means responsive to said sensing means for selecting data corresponding to the absolute angle patterns to produce high-order angle data; and
   low-order angle data producing means responsive to said sensing means for selecting data corresponding to the relative angle patterns to produce low-order angle data.

2. A rotary encoder as claimed in claim 1 wherein the rotating body is comprised of a rotating disc.

3. A rotary encoder as claimed in claim 1 wherein the rotating body is comprised of a cylindrical body.

4. The rotary encoder of claim 1 wherein the patterns of adjacent said blocks are radially displaced with respect to one another.

5. The rotary encoder of claim 1 wherein said blocks have substantially the same circumferential length.

6. The rotary encoder of claim 4 wherein the absolute angle patterns comprise lines extending circumferentially a distance twice that of said blocks, with each line extending radially outwardly of a separate first block and radially inwardly of a block adjacent the respective first block.

7. A rotary encoder comprising:
   a code plate made in the form of a rotating disc, which is provided with a plurality of digital code patterns formed in a radial direction indicative of absolute angle ranges and a plurality of linear patterns indicative of relative angles that are disposed in the respective individual absolute angle ranges and inclined with respect to the radial direction of the rotating disc;
   said digital code patterns extending in the circumferential direction of said disc through predetermined angles with adjacent patterns being positioned at different radial positions of said disc;
   means for sensing said patterns;
   high-order angle data producing means responsive to said sensing means for selecting data corresponding to the digital code patterns to produce high-order angle data; and
   low-order angle data producing means responsive to said sensing means for selecting data corresponding to the linear patterns to produce low-order angle data.

8. A rotary encoder as claimed in claim 7 wherein the digital code patterns and the linear patterns are at least partially overlapped with respect to one another 1 circumferentially by a given angle in boundary areas of adjacent absolute angle ranges.

9. A rotary encoder comprising a code plate made in the form of a rotating disc which is provided with a plurality of codes each indicative of an absolute angle that are provided in the form of optical patterns, and an optical sensor for reading the codes,
   characterized in that the code plate comprises an opaque plate which is provided with codes formed by slits in the code plate, and each specified angle is coded in a coding way different from that for every other angle, said codes being comprised of a plurality of circumferentially extending blocks of predetermined equal length, the slits of each block being positioned differently than in the respective adjacent blocks, with the slits in each code block being not contiguous with those of respective adjacent code blocks, and further comprising angle data producing means for producing angle data on the basis of the output data of the optical sensor, said angle data producing means comprising a line sensor extending in a circumferential direction of the code plate.

10. A rotary encoder comprising:
    a code plate made in the form of a rotating body, which is provided with a plurality of code patterns arranged in the circumferential direction of the code plate and selectively indicative of an absolute angle range and relative angle;

a line sensor for reading the code patterns and the relative angle patterns in a circumferential direction of the code plate;

high-order angle data producing means for producing high-order angle data on the basis of the code patterns relating to absolute angle range read by the line sensor; and low-order angle data producing means for producing low-order angle data on the basis of the distance between the reference position of the line sensor and a position at which each of the code patterns relating to relative angle is detected.

11. A rotary encoder comprising:

a cylindrical rotating body provided on its surface with a plurality of digital code patterns each indicative of an absolute angle range and a plurality of linear patterns each indicative of a relative angle that are disposed in the individual absolute angle ranges and inclined with respect to the axial direction of the rotating body;

said digital code patterns comprising a plurality of circumferentially distributed blocks of patterns, with the patterns of each of the blocks being circumferentially displaced with respect to the pattern of the respective adjacent blocks;

means for sensing said patterns;

high-order angle data producing means responsive to said sensing means for selecting data corresponding to the digital code patterns to produce high-order angle data; and low-order angle data producing means responsive to said sensing means for selecting data corresponding to the linear patterns to produce low-order data.

12. A rotary encoder as claimed in claim 11 wherein the digital code patterns and the linear patterns are at least partially overlapped with each other circumferentially by a given angle in boundary areas of adjacent absolute angle ranges.

13. A rotary encoder comprising:

a code plate comprising a cylindrical rotating body, the surface of the plate having a plurality of code patterns in a circumferential direction and selectively indicative of an absolute angle range and relative angles;

a line sensor positioned to read the code patterns in a circumferential direction, said sensor having a reference position;

high-order angle data producing means for producing high-order angle data on the basis of the code patterns indicative of an absolute angle range read by the line sensor; and low-order angle data producing means for producing low-order angle data on the basis of the distance between the reference position of the line sensor and a position at which each of the code patterns indicative of relative angle is detected.

14. A rotary encoder comprising:

a rotating body provided on its surface with a plurality of absolute angle patterns indicative of absolute angle ranges and a plurality of relative angle patterns indicative of relative angles;

said absolute angle patterns comprising a plurality of circumferentially spaced blocks of radially encoded elements, the relationship between the angular and radial displacements of each block and the positions of the encoded elements in adjacent blocks being different means for sensing said patterns;

high-order angle data producing means responsive to said sensing means for selecting data corresponding to the absolute angle patterns to produce high-order angle data; and low-order angle data producing means responsive to said sensing means for selecting data corresponding to the relative angle patterns to produce low-order angle data.

15. The rotary encoder of claim 14 wherein the encoded elements of adjacent blocks have different encodings with respect to the angular displacement of the respective blocks, whereby the circumferential length of encoded elements that are contiguous between adjacent blocks have a maximum predetermined circumferential length.

* * * * *